(12) United States Patent
Wang et al.

(10) Patent No.: US 12,211,901 B2
(45) Date of Patent: Jan. 28, 2025

(54) SEMICONDUCTOR DEVICE HAVING A DOPED FIN WELL

(71) Applicant: Taiwan Semiconductor Manufacturing Co., Ltd., Hsinchu (TW)

(72) Inventors: Bau-Ming Wang, Kaohsiung (TW); Che-Fu Chiu, New Taipei (TW); Chun-Feng Nieh, Hsinchu (TW); Huicheng Chang, Tainan (TW); Yee-Chia Yeo, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 215 days.

(21) Appl. No.: 17/869,321

(22) Filed: Jul. 20, 2022

(65) Prior Publication Data
US 2022/0352321 A1    Nov. 3, 2022

Related U.S. Application Data

(62) Division of application No. 17/075,992, filed on Oct. 21, 2020, now Pat. No. 11,450,743.

(51) Int. Cl.
*H01L 29/10* (2006.01)
*H01L 21/02* (2006.01)
(Continued)

(52) U.S. Cl.
CPC .... *H01L 29/1083* (2013.01); *H01L 21/02532* (2013.01); *H01L 21/26513* (2013.01); *H01L 21/266* (2013.01); *H01L 21/28088* (2013.01); *H01L 21/74* (2013.01); *H01L 21/823807* (2013.01); *H01L 21/823814* (2013.01);
(Continued)

(58) Field of Classification Search
CPC ..... H01L 21/823431; H01L 21/823821; H01L 21/845; H01L 27/0886; H01L 27/0924; H01L 27/1211; H01L 27/10826; H01L 27/10879; H01L 29/41791; H01L 29/66795–66818; H01L 29/785–7856; H01L 2029/7857–7858; H01L 2924/13067; H01L 29/78696; H01L 29/42392; H01L 29/0673; H01L 29/66439; H01L 29/775; H01L 29/1083; H01L 27/0925; H01L 27/0927; H01L 27/0928; H01L 21/823493; H01L 21/823892;
(Continued)

(56) References Cited

U.S. PATENT DOCUMENTS 9,082,853 B2    7/2015    Cheng et al.
9,093,530 B2    7/2015    Huang et al.
(Continued)

*Primary Examiner* — Younes Boulghassoul
(74) *Attorney, Agent, or Firm* — Slater Matsil, LLP

(57) ABSTRACT

A semiconductor device may include a semiconductor fin, a source/drain region extending from the semiconductor fin, and a gate electrode over the semiconductor fin. The semiconductor fin may include a first well and a channel region over the first well. The first well may have a first dopant at a first dopant concentration and the channel region may have the first dopant at a second dopant concentration smaller than the first dopant concentration. The first dopant concentration may be in range from $10^{17}$ atoms/cm$^3$ to $10^{19}$ atoms/cm$^3$.

20 Claims, 25 Drawing Sheets

(51) Int. Cl.

| | |
|---|---|
| *H01L 21/265* | (2006.01) |
| *H01L 21/266* | (2006.01) |
| *H01L 21/28* | (2006.01) |
| *H01L 21/74* | (2006.01) |
| *H01L 21/8238* | (2006.01) |
| *H01L 27/092* | (2006.01) |
| *H01L 29/08* | (2006.01) |
| *H01L 29/49* | (2006.01) |
| *H01L 29/66* | (2006.01) |
| *H01L 29/78* | (2006.01) |

(52) U.S. Cl.
CPC ........... *H01L 21/823821* (2013.01); *H01L 21/823842* (2013.01); *H01L 21/823871* (2013.01); *H01L 27/0924* (2013.01); *H01L 27/0928* (2013.01); *H01L 29/0847* (2013.01); *H01L 29/1054* (2013.01); *H01L 29/4966* (2013.01); *H01L 29/66545* (2013.01); *H01L 29/66795* (2013.01); *H01L 29/785* (2013.01)

(58) Field of Classification Search
CPC ..... H01L 21/823807; H01L 21/823412; H01L 29/105; H01L 29/1054
See application file for complete search history.

(56) References Cited

U.S. PATENT DOCUMENTS

| | | | |
|---|---|---|---|
| 9,171,929 | B2 | 10/2015 | Lee et al. |
| 9,214,555 | B2 | 12/2015 | Oxland et al. |
| 9,236,267 | B2 | 1/2016 | De et al. |
| 9,520,482 | B1 | 12/2016 | Chang et al. |
| 9,548,303 | B2 | 1/2017 | Lee et al. |
| 9,564,489 | B2 | 2/2017 | Yeo et al. |
| 9,576,814 | B2 | 2/2017 | Wu et al. |
| 9,601,342 | B2 | 3/2017 | Lee et al. |
| 9,608,116 | B2 | 3/2017 | Ching et al. |
| 2015/0044829 | A1 | 2/2015 | Kim et al. |
| 2015/0287828 | A1 | 10/2015 | Zhu et al. |
| 2016/0149003 | A1 | 5/2016 | Choi et al. |
| 2016/0204039 | A1 | 7/2016 | Togo |
| 2017/0125413 | A1* | 5/2017 | Wu ................... H01L 21/76224 |
| 2018/0190654 | A1 | 7/2018 | Wu et al. |
| 2018/0331104 | A1* | 11/2018 | Bi ......................... H01L 29/165 |
| 2019/0080910 | A1* | 3/2019 | Reznicek .............. H01L 29/785 |
| 2019/0198398 | A1 | 6/2019 | De Silva et al. |
| 2020/0027877 | A1 | 1/2020 | Kim et al. |
| 2020/0105936 | A1* | 4/2020 | More ................ H01L 29/41791 |
| 2020/0135469 | A1* | 4/2020 | Liu ....................... H01L 21/266 |
| 2021/0043624 | A1* | 2/2021 | Adusumilli ......... H01L 27/0886 |

* cited by examiner

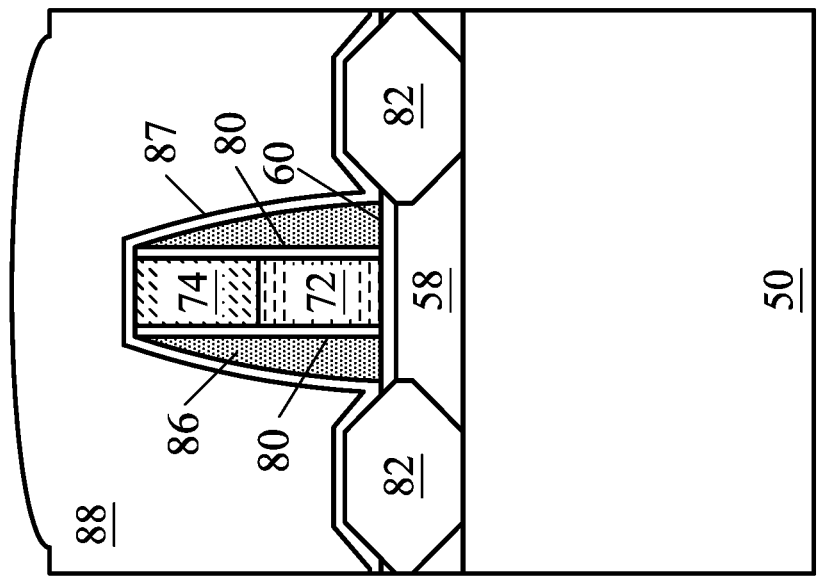
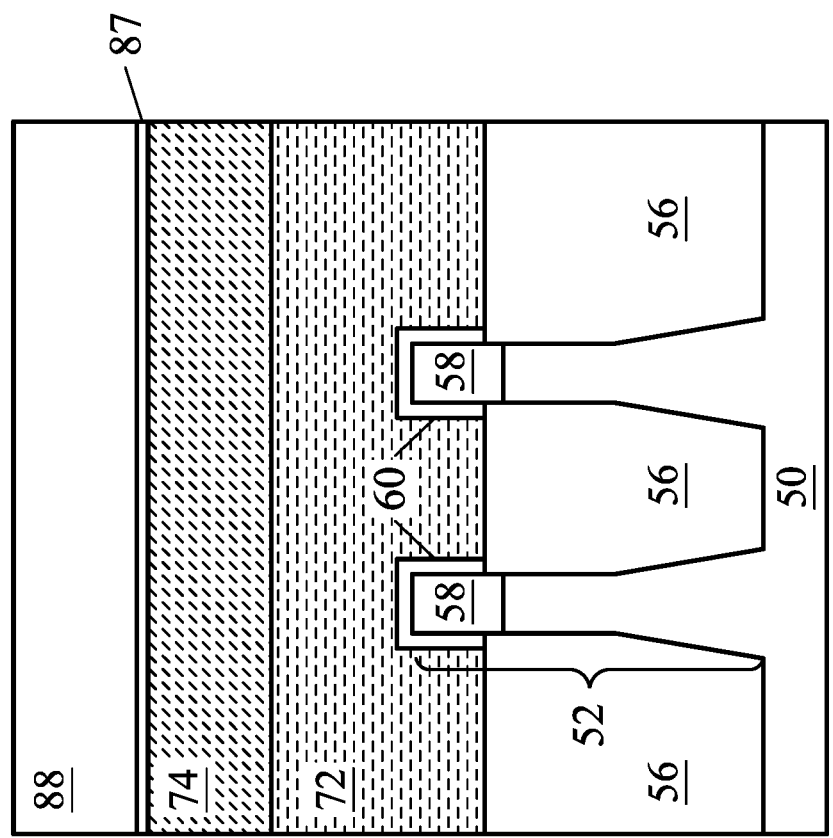
Figure 17B
Figure 17A

SEMICONDUCTOR DEVICE HAVING A DOPED FIN WELL

PRIORITY CLAIM AND CROSS-REFERENCE

This application is a divisional of U.S. patent application Ser. No. 17/075,992, filed on Oct. 21, 2020, entitled "Method of Forming a Semiconductor Device with Implantation of Impurities at High Temperature," which application is hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 10, 11, 12A, 12B, 13, 14A, 14B, 15A, 15B, 16A, 16B, 16C, 16D, 17A, 17B, 18A, 18B, 19A, 19B, 20A, 20B, 20C, 21A, 21B, 22A, and 22B are cross-sectional views of further intermediate stages in the manufacturing of FinFETs, in accordance with some embodiments.

DETAILED DESCRIPTION

Figure 1:
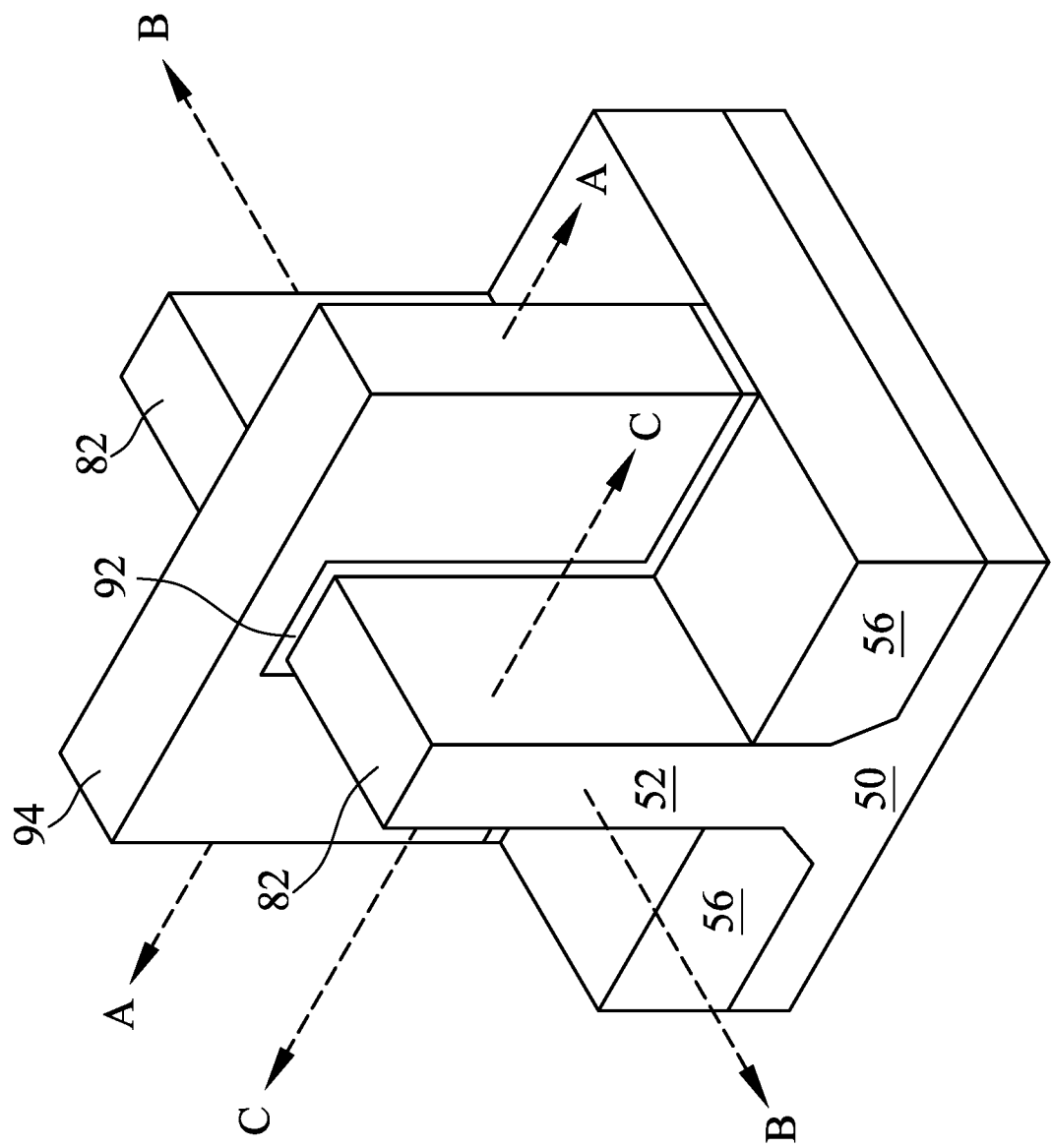
FIG. 1 illustrates an example of a FinFET in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments such as those disclosed herein provide well implants performed at elevated temperatures, thereby decreasing interstitial defects. Implantations of impurities to form well regions may be performed at higher doses to achieve trigger voltages ($V_{trigger}$) of subsequently formed transistors, such as MOSFETs, of greater than about 1.7 V by reducing well resistance and isolation leakage current, such as from highly doped source/drain regions to well regions. Performing impurity implants such as these at hot temperatures, for example, greater than about 150° C., may be useful for reducing the density of point defects created within semiconductor substrates by implanting heavy species of dopants such as arsenic and phosphorus. By performing impurity implants at hot temperatures greater than about 150° C., fewer substrate interstitials may be created, which may reduce substrate extended defects, such as stacking faults and dislocation during subsequent thermal processing, thereby increasing device performance.

FIG. 1 illustrates an example of a FinFET in a three-dimensional view, in accordance with some embodiments. The FinFET comprises a fin 52 on a substrate 50 (e.g., a semiconductor substrate). Isolation regions 56 are disposed in the substrate 50, and the fin 52 protrudes above and from between neighboring isolation regions 56. Although the isolation regions 56 are described/illustrated as being separate from the substrate 50, as used herein the term "substrate" may be used to refer to just the semiconductor substrate or a semiconductor substrate inclusive of isolation regions. Additionally, although the fin 52 is illustrated as a single, continuous material as the substrate 50, the fin 52 and/or the substrate 50 may comprise a single material or a plurality of materials. In this context, the fin 52 refers to the portion extending between the neighboring isolation regions 56.

A gate dielectric layer 92 is along sidewalls and over a top surface of the fin 52, and a gate electrode 94 is over the gate dielectric layer 92. Source/drain regions 82 are disposed in opposite sides of the fin 52 with respect to the gate dielectric layer 92 and gate electrode 94. FIG. 1 further illustrates reference cross-sections that are used in later figures. Cross-section A-A is along a longitudinal axis of the gate electrode 94 and in a direction, for example, perpendicular to the direction of current flow between the source/drain regions 82 of the FinFET. Cross-section B-B is perpendicular to cross-section A-A and is along a longitudinal axis of the fin 52 and in a direction of, for example, a current flow between the source/drain regions 82 of the FinFET. Cross-section C-C is parallel to cross-section A-A and extends through a source/drain region of the FinFET. Subsequent figures refer to these reference cross-sections for clarity.

Some embodiments discussed herein are discussed in the context of FinFETs formed using a gate-last process. In other embodiments, a gate-first process may be used. Also, some embodiments contemplate aspects used in planar devices, such as planar FETs, nanostructure (e.g., nanosheet, nanowire, gate-all-around, or the like) field effect transistors (NSFETs), or the like.

FIGS. 2 through 8 and 10 through 22B are cross-sectional views of intermediate stages in the manufacturing of FinFETs, in accordance with some embodiments. FIGS. 2 through 8 and 10 through 13 illustrate reference cross-section A-A illustrated in FIG. 1, except for multiple fins/FinFETs. FIGS. 14A, 15A, 16A, 17A, 18A, 19A, 20A, 21A, and 22A are illustrated along reference cross-section A-A illustrated in FIG. 1, and FIGS. 14B, 15B, 16B, 17B, 18B, 19B, 20B, 20C, 21B, and 22B are illustrated along a similar cross-section B-B illustrated in FIG. 1, except for multiple fins/FinFETs. FIGS. 16C and 16D are illustrated along reference cross-section C-C illustrated in FIG. 1, except for multiple fins/FinFETs.

Figure 2:
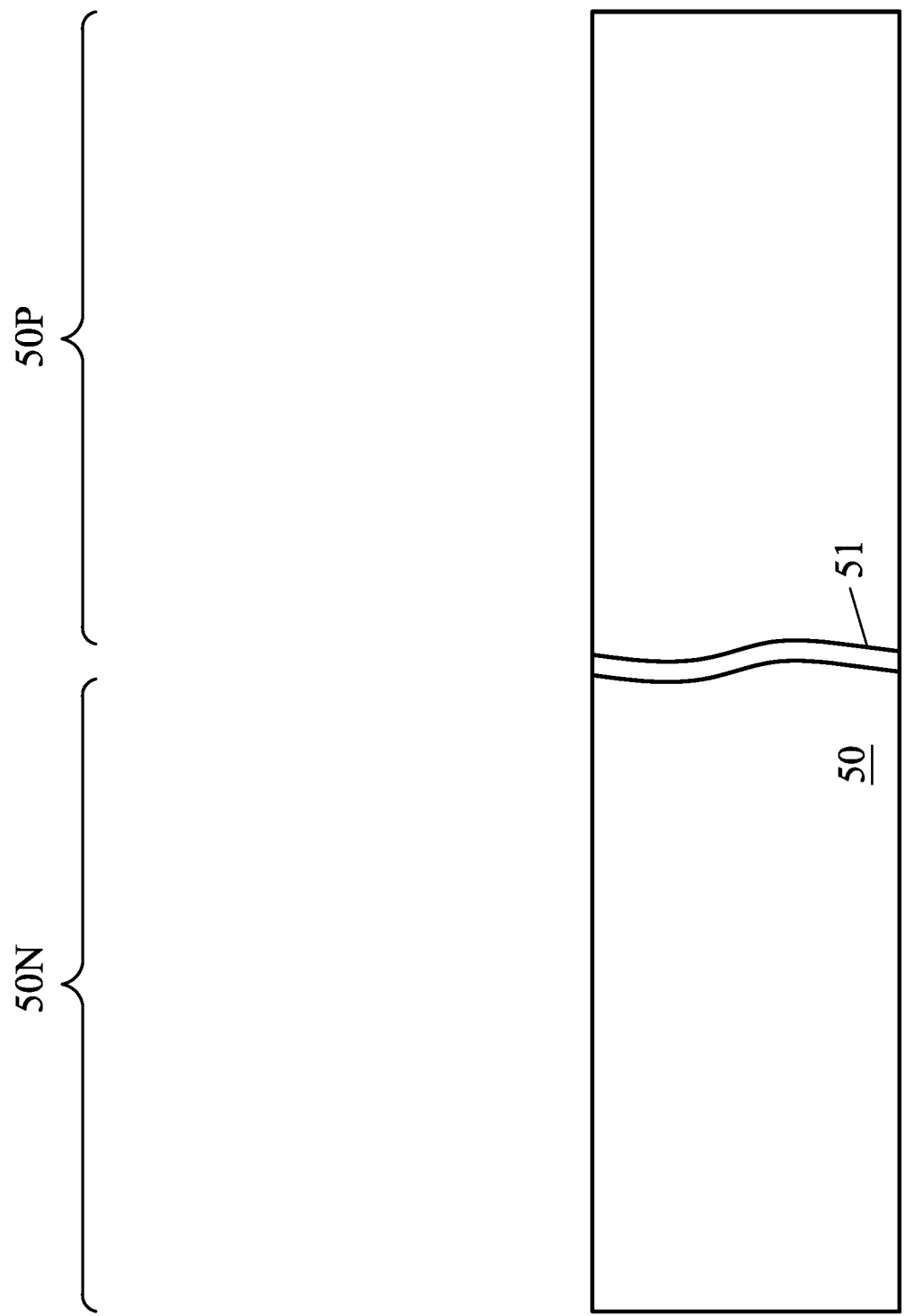
FIGS. 2, 3, 4, 5, 6, 7, and 8 are cross-sectional views of intermediate stages in the manufacturing of FinFETs, in accordance with some embodiments.

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

The substrate 50 has an n-type region 50N and a p-type region 50P. The n-type region 50N can be for forming n-type devices, such as NMOS transistors, e.g., n-type FinFETs. The p-type region 50P can be for forming p-type devices, such as PMOS transistors, e.g., p-type FinFETs. The n-type region 50N may be physically separated from the p-type region 50P (as illustrated by divider 51), and any number of device features (e.g., other active devices, doped regions, isolation structures, etc.) may be disposed between the n-type region 50N and the p-type region 50P.

Figure 3:
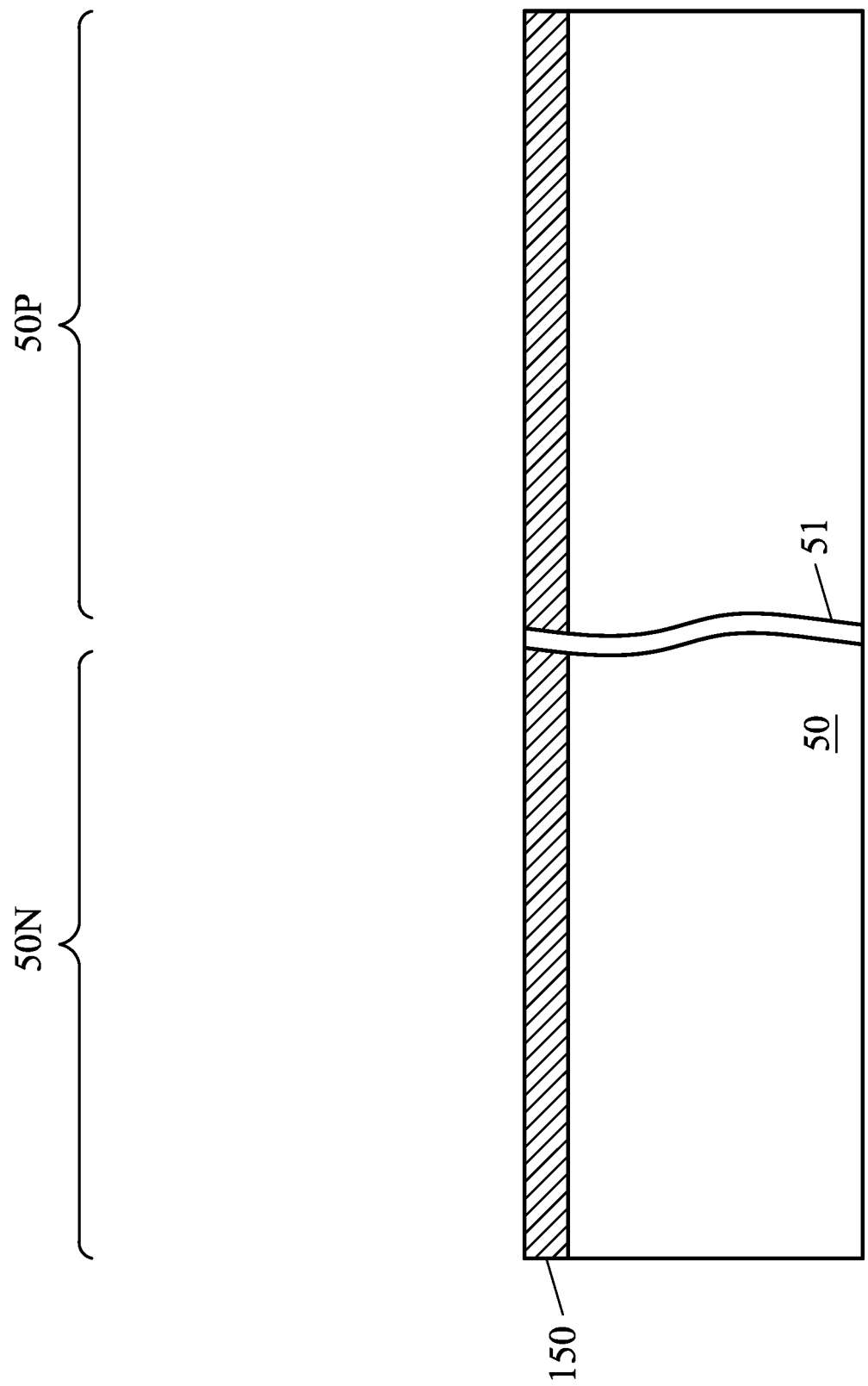
Figure 4:
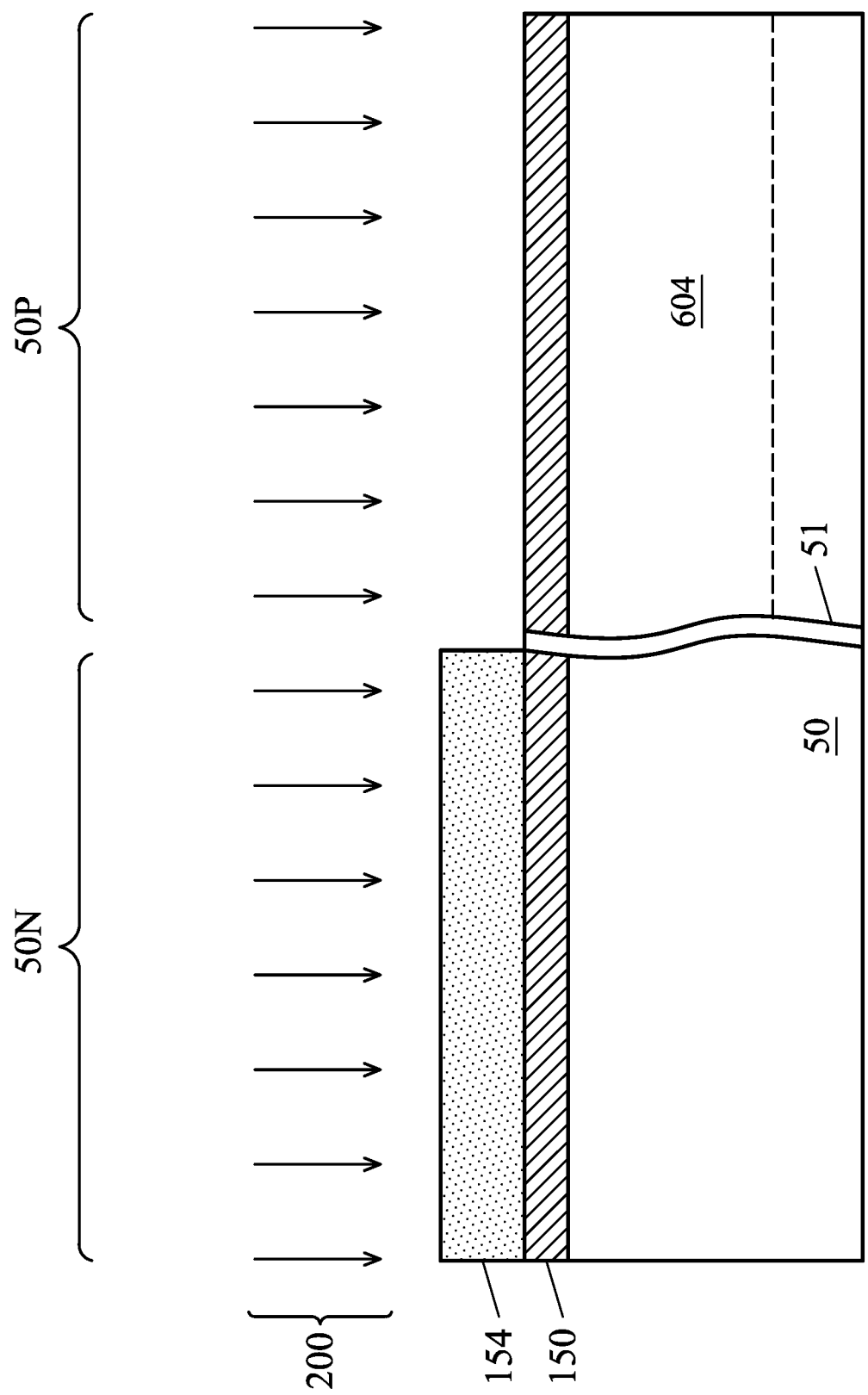
Figure 5:
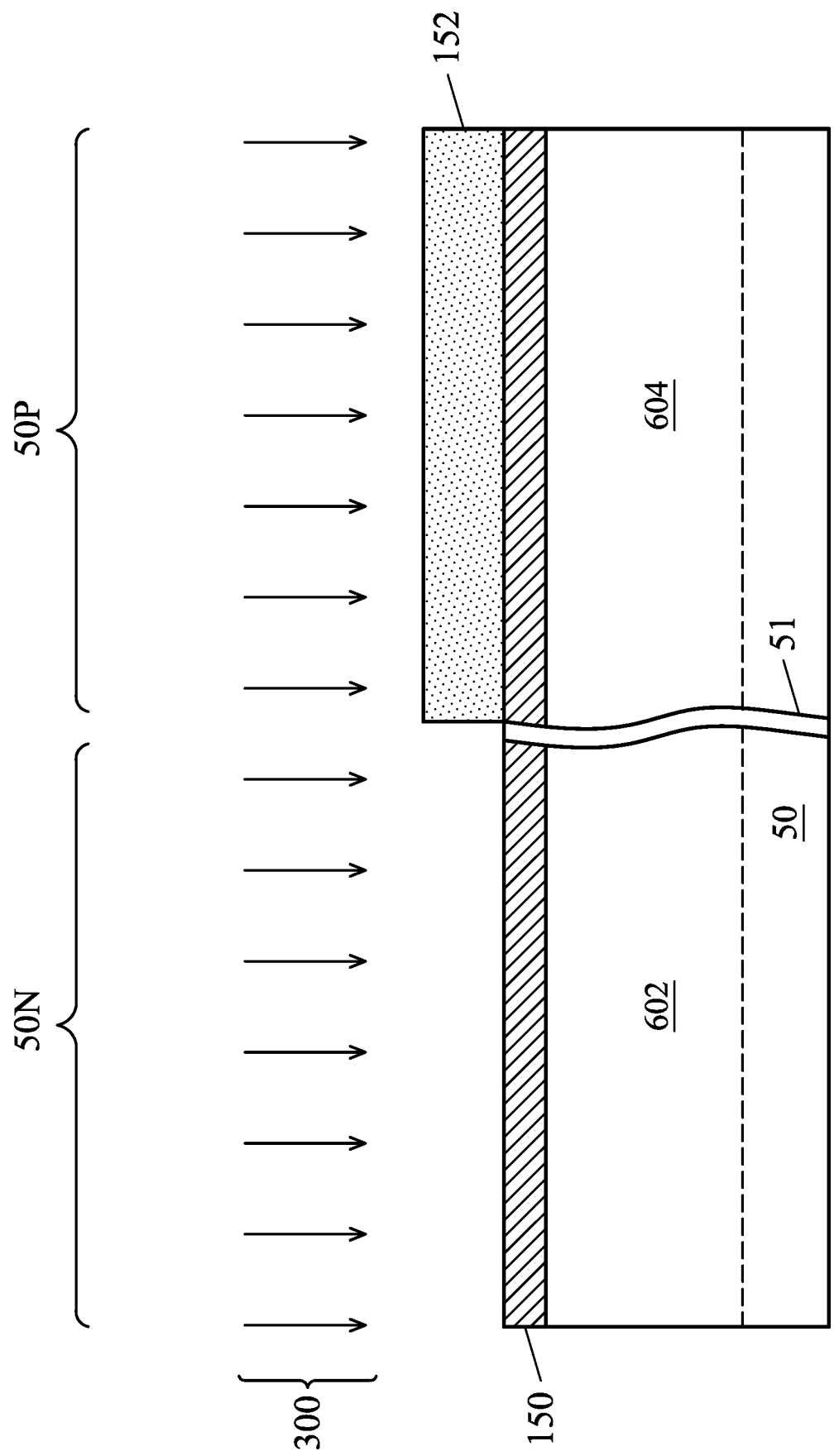

In FIGS. 3-5, appropriate wells may be formed in the fins 52 and/or the substrate 50. In some embodiments, a P well may be formed in the n-type region 50N, and an N well may be formed in the p-type region 50P. In some embodiments, a P well or an N well are formed in both the n-type region 50N and the p-type region 50P. FIGS. 3-5 illustrate an N well being formed first in the p-type region 50P followed by a P well being formed subsequently in the n-type region 50N, in accordance with some embodiments. In other embodiments, the P well may be formed first in the n-type region 50N followed by the N well being formed subsequently in the p-type region 50P. As will be discussed in greater detail below, the N well in the p-type region 50P will form a well over which a channel layer for a p-type device is formed, and the P well in the n-type region 50N will form a p well over which a channel layer for an n-type device is formed.

Referring first to FIG. 3, a first mask 150, also referred to as a mask layer 150, may be formed over the substrate 50. The first mask 150 is an optional mask that may be useful for reducing residuals in or on the substrate 50 from outgassing and/or removal processes of subsequently formed photoresists, such as e.g. the second mask 154 and the third mask 152 (see below, FIGS. 4 and 5). In some embodiments, the first mask 150 comprises a pad oxide layer, a pad nitride layer, the like, or a combination thereof. The pad oxide layer may be a thin film comprising silicon oxide and/or silicon dioxide ($SiO_2$) formed, for example, using a thermal oxidation process or a deposition process such as chemical vapor deposition (CVD), low-pressure chemical vapor deposition (LPCVD), or plasma enhanced chemical vapor deposition (PECVD). However, any suitable method may be used to form the pad oxide layer. The pad nitride layer may be formed of silicon nitride (SiN), for example, using CVD, LPCVD, or PECVD. However, any suitable method may be used to form the pad nitride layer. In some embodiments, such as embodiments in which subsequent ion implantations (see below, FIGS. 4-5) are performed at a temperature below about 170° C., the first mask 150 may be omitted.

In FIG. 4, an N well 604 is formed in the p-type region 50P with an n-type impurity hot implant 200, which may be useful for reducing substrate defects. A second mask 154, such as a photoresist, is formed over the substrate 50 and patterned to expose the p-type region 50P of the substrate 50 or, if present, the first mask 150 over the p-type region 50P of the substrate. The second mask 154 can be formed by using a spin-on technique and can be patterned using acceptable photolithography techniques. Once the second mask 154 is patterned and developed, an n-type impurity hot implant 200 may be performed in the p-type region 50P. The second mask 154 may act as a mask to substantially prevent n-type impurities from being implanted into the n-type region 50N. In some embodiments in which the first mask 150 is present, the n-type impurity hot implant 200 drives the n-type impurities through the first mask 150 into the p-type region 50P of the substrate 50. The n-type impurities may be phosphorus, arsenic, antimony, or the like.

The n-type impurity hot implant 200 may be a suitable process such as an ion implantation and may be performed with a dose, or doping concentration, in a range of about $1.5 \times 10^{14}$ cm$^{-2}$ to about $3.0 \times 10^{14}$ cm$^{-2}$, which may be useful for achieving a trigger voltage ($V_{trigger}$) of a subsequently formed transistor, such as a MOSFET, of greater than about 1.7 V by reducing well resistance and isolation leakage current, such as from a n+ highly doped source/drain region to the N well 604 (N+NW leakage). Performing the n-type impurity hot implant 200 with a dose of less than about $1.5 \times 10^{14}$ cm$^{-2}$ may be disadvantageous by causing higher well resistance and N+NW leakage, which may lead to a $V_{trigger}$ of less than about 1.7 V. Performing the n-type impurity implant 200 with a dose of more than about $3.0 \times 10^{14}$ cm$^{-2}$ may be disadvantageous because it may create lots of point defects which can form extended defects during a following anneal. The ion implantation may be performed with an energy in a range of about 5 keV to about 150 keV, for a duration in a range of about 2 seconds to about 10 seconds. The chamber pressure during the n-type impurity hot implant 200 may be in a range of about $1 \times 10^{-5}$ torr to about $6 \times 10^{-5}$ torr. The n-type dopant may be implanted to a depth in the N well 604 of about 20 nm to about 600 nm. The N well 604 may have a volume concentration of the n-type dopant in a range of about $1 \times 10^{17}$ atoms/cm$^3$ to about $1 \times 10^{19}$ atoms/cm$^3$ after the n-type impurity hot implant 200 is performed.

Performing the n-type impurity hot implant 200 at a temperature in a range of about 150° C. to about 500° C., such as about 170° C. to about 300° C., may be useful for preventing/reducing the formation of point defects created within the substrate 50 by implanting heavy species of dopants such as arsenic and phosphorus. For example, performing the n-type impurity hot implant 200 at a temperature in a range of about 150° C. to about 500° C. may lead to the substrate defect area density being less than about $5 \times 10^7$ cm$^{-2}$, such as in a range of about $1 \times 10^7$ cm$^{-2}$ to about $5 \times 10^7$ cm$^{-2}$. This may reduce substrate extended defects during subsequent thermal processing, thereby increasing device performance. Implantation of heavy species of dopants at doses of about $1.5 \times 10^{14}$ cm$^{-2}$ to about $3.0 \times 10^{14}$ cm$^{-2}$ performed at temperatures less than about 150° C. may cause interstitial defects in the substrate 50, such as an Si substrate, and may lead to the substrate defect density being more that about $5 \times 10^7$ cm$^{-2}$. This may lead to the formation of extended defects such as stacking faults and dislocation during subsequent thermal processing. These extended defects may cause degradation of mobility in subsequently formed epitaxial channel regions (see below, FIG. 7). Performing the n-type impurity hot implant 200 at a temperature of more than about 500° C. may be disadvantageous because it may lead to mismatched dopant profile and worse particle performance.

For example, in some embodiments performing the n-type impurity hot implant 200 with heavy species at about 150° C. may reduce the number of substrate defects formed to about 10 times fewer than the number of substrate defects formed by performing an n-type impurity implant with heavy species at room temperature, such as a substrate defect area density in a range of about $5 \times 10^8$ cm$^{-2}$ to about $1 \times 10^{10}$ cm$^{-2}$. As another example, performing the n-type impurity hot implant 200 with heavy species at about 300° C. may reduce the number of substrate defects formed to about 12 times fewer than the number of substrate defects formed by performing an n-type impurity implant with heavy species at room temperature.

In some embodiments, the n-type impurity hot implant 200 is performed at a temperature in a range of about 150° C. to about 170° C. For temperatures in the range of about 150° C. to about 170° C., formation of the first mask 150, as described above with respect to FIG. 3, may be omitted due the lower temperature resulting in less outgassing from photoresists, such as e.g. the second mask 154, and fewer residuals from removal of the second mask 154. This may be useful for effectively avoiding flow integration issues. In some embodiments in which the n-type impurity hot implant 200 is performed at a temperature greater than about 170° C., the formation of first mask 150 may be desirable to reduce residuals in or on the substrate 50 from outgassing and/or removal processes of photoresists such as e.g. the second mask 154.

In FIG. 5, a P well 602 is formed in the n-type region 50N with a p-type impurity implant 300. A third mask 152, such as a photoresist, is formed over the substrate 50. The third mask 152 is patterned to expose the n-type region 50N of the substrate 50 or the first mask 150 over the n-type region 50N of the substrate if the first mask 150 is present. The third mask 152 can be formed by using a spin-on technique and can be patterned using acceptable photolithography techniques. Once the third mask 152 is patterned and developed, a p-type impurity implant 300 may be performed in the n-type region 50N, and the third mask 152 may act as a mask to substantially prevent p-type impurities from being implanted into the p-type region 50P. In some embodiments in which the first mask 150 is present, the p-type impurity implant 300 drives the p-type impurities through the first mask 150 into the n-type region 50N of the substrate 50. The p-type impurities may be boron, boron fluoride e.g. BF$_2$, indium, or the like.

The p-type impurity implant 300 may be a suitable process such as an ion implantation and may be performed with a dose, or doping concentration, in a range of about $1.5 \times 10^{14}$ cm$^{-2}$ to about $3.0 \times 10^{14}$ cm$^{-2}$, which may be useful for achieving a trigger voltage (V$_{trigger}$) of a subsequently formed transistor, such as a MOSFET, of greater than about 1.7 V by reducing well resistance and isolation leakage current, such as from a p+ highly doped source/drain region to the P well 602 (P+PW leakage). V$_{trigger}$ may be approximately equal to the breakdown voltage of the P-N junction of a transistor. When two bipolar junction transistors (BJTs), such as MOSFETS, are in parallel, then the DC power supply connected to the drain terminal V$_{DD}$ being larger than V$_{trigger}$ may trigger positive feedback of the two BJTs in parallel, which may cause the leakage current to burn out. Performing the p-type impurity implant 300 with a dose of less than about $1.5 \times 10^{14}$ cm$^{-2}$ may be disadvantageous by causing higher well resistance and P+PW leakage, which may lead to a V$_{trigger}$ of less than about 1.7 V. Performing the p-type impurity implant 300 with a dose of more than about $3.0 \times 10^{14}$ cm$^{-2}$ may be disadvantageous because it can create many point defects which may form extended defects during a following thermal process.

The p-type impurity implant 300 may be an ion implantation process performed at an ion implantation energy in a range of about 5 keV to about 60 keV for a duration in a range of about 3 seconds to about 10 seconds and at room temperature. The chamber pressure during the p-type impurity implant 300 may be in a range of about $1 \times 10^{-5}$ torr to about $6 \times 10^{-5}$ torr. The p-type dopant may be implanted to a depth in the P well 602 of about 20 nm to about 600 nm. In some embodiments, the p-type impurities may be implanted in the region to a concentration of in a range of, for example, about $10^{16}$ cm$^{-3}$ and about $10^{19}$ cm$^{-3}$. After the implant, the third mask 152 may be removed, such as by an acceptable ashing process.

In some embodiments, the p-type impurity implant 300 as described above with respect to FIG. 5 may also be performed as a hot implant at a temperature in a range of about 150° C. to about 500° C., such as about 170° C. to about 300° C., using similar methods as the n-type impurity hot implant 200 as described above with respect to FIG. 4. This may be useful for reducing the formation of substrate defects during the formation of the P well 602 when the p-type impurity being implanted is a relatively heavier species, such as e.g. BF$_2$.

Figure 6:
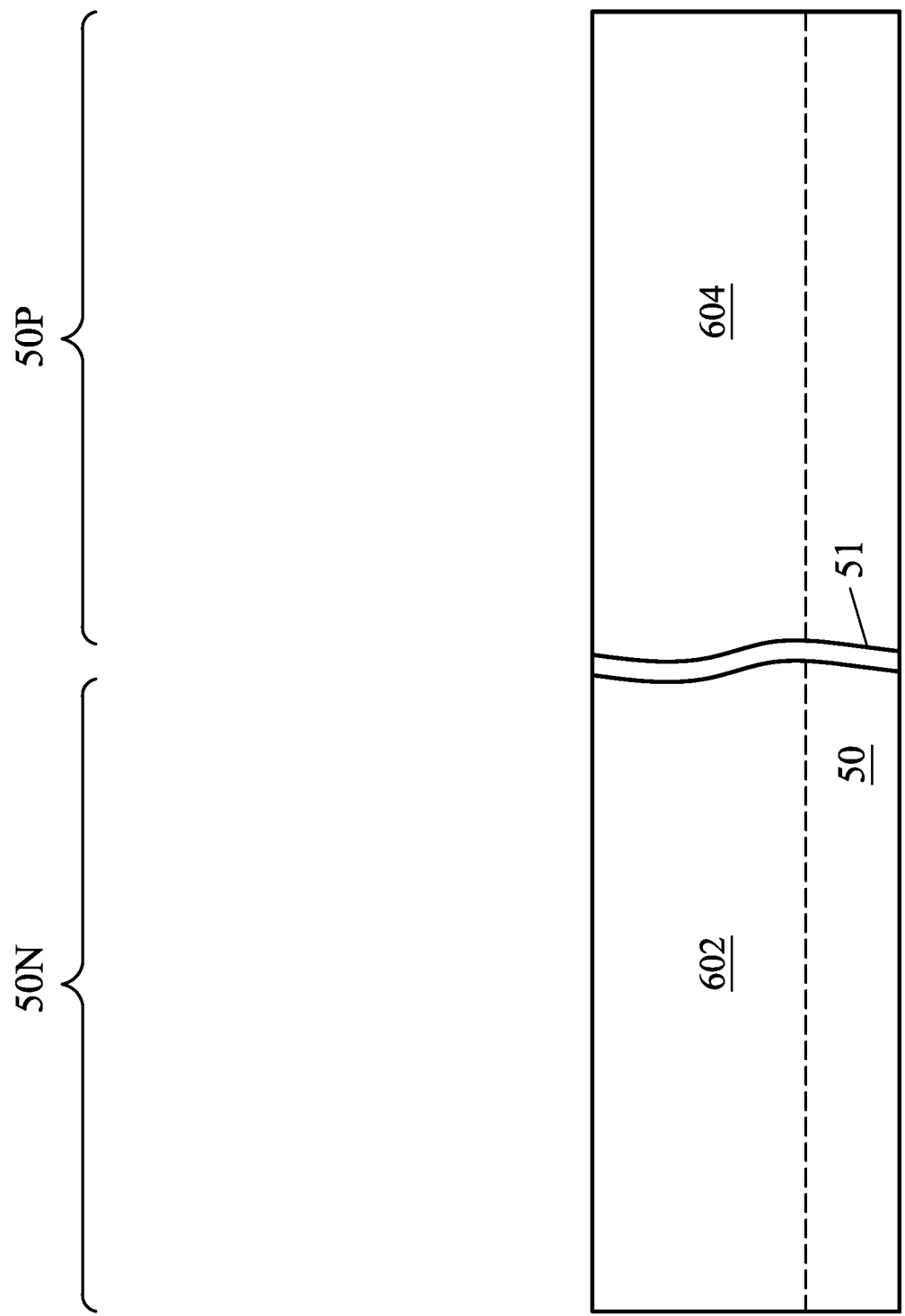

In FIG. 6, the third mask 152 may be removed, such as by an acceptable ashing process. In embodiments where the first mask 150 is present, the first mask 150 may be removed, such as by an acceptable etching process e.g. a dry or wet etch. After the implants of the n-type region 50N and the p-type region 50P, an anneal may be performed to repair implant damage and to activate the p-type and/or n-type impurities that were implanted.

Figure 7:
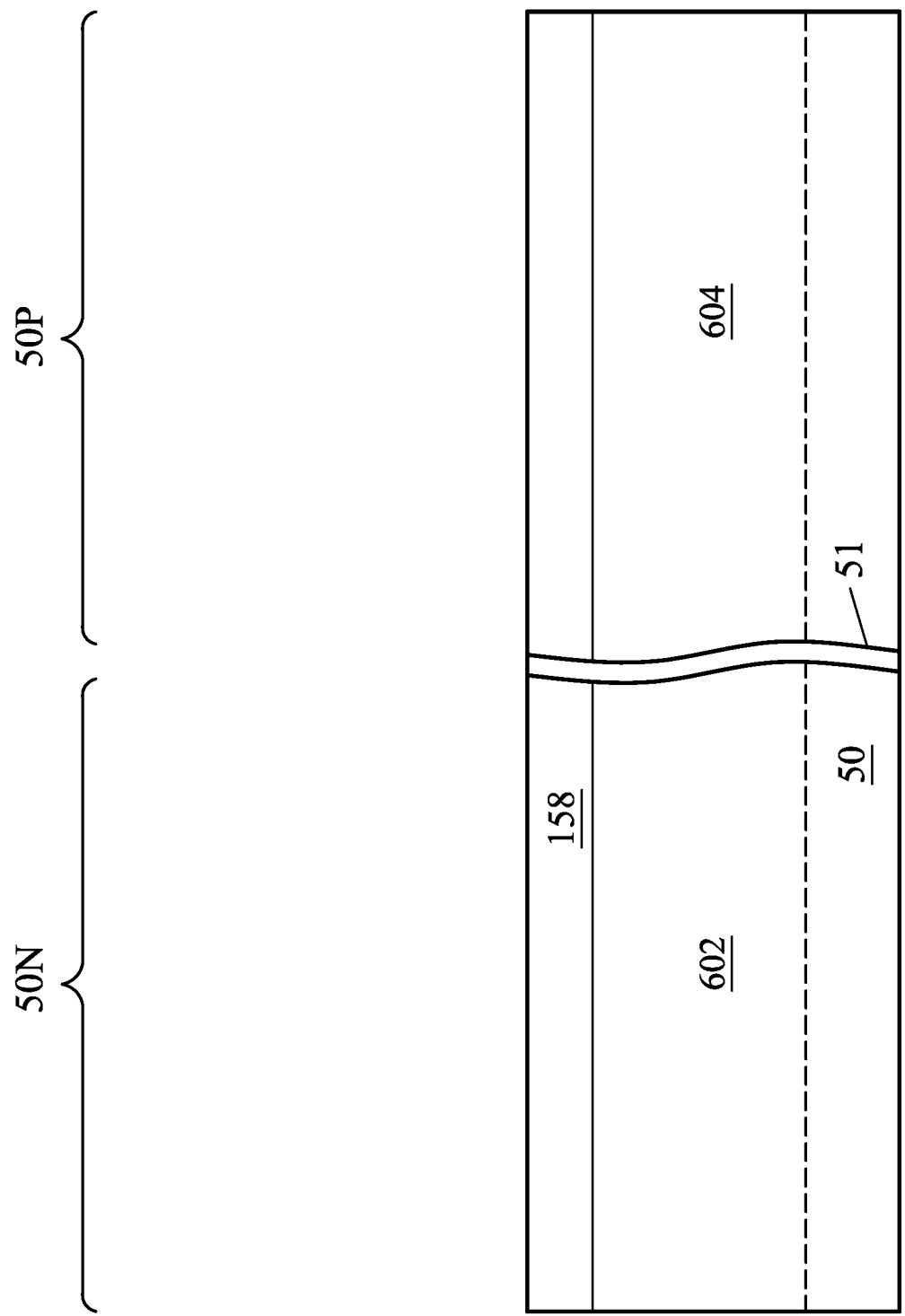

In FIG. 7, a semiconductor layer 158 is formed over the substrate 50 by a suitable process, such as epitaxial growth. The semiconductor layer 158 may be used to form channel regions 58 in the top portions of subsequently formed fins 52 (see below, FIG. 8). In various embodiments, the semiconductor layer 158 may be formed from silicon or from other materials such as silicon-germanium (Si$_x$Ge$_{1-x}$, where x can be in the range of 0 to 1), silicon carbide, pure or substantially pure germanium, a III-V compound semiconductor, a II-VI compound semiconductor, or the like. For example, the available materials for forming III-V compound semiconductor include, but are not limited to, indium arsenide, aluminum arsenide, gallium arsenide, indium phosphide, gallium nitride, indium gallium arsenide, indium aluminum arsenide, gallium antimonide, aluminum antimonide, aluminum phosphide, gallium phosphide, and the like. An advantageous feature of these embodiments is that the subsequently formed channel regions 58 may be formed of low-bandgap materials, which may improve carrier mobility. Additionally, the thickness of the semiconductor layer 158 may still be relatively small, so that stress-relaxation is reduced. In some embodiments, it may be advantageous to epitaxially grow a material in n-type region 50N (e.g., an NMOS region) different from the material in p-type region 50P (e.g., a PMOS region). For example, portions of the semiconductor layer 158 in n-type region 50N may be formed with a different material from portions of the semiconductor layer 158 in p-type region 50P.

The semiconductor layer 158 may be implanted with dopants, similar to the process discussed above for forming N wells 604 and P wells 602 in respect to FIGS. 4 and 5, respectively, followed by an anneal. In some embodiments, the semiconductor layer 158 may be in situ doped during growth. The semiconductor layer 158 may be doped with n-type impurities in the p-type region 50P and with p-type impurities in the n-type region 50N. The n-type and/or p-type impurities for the semiconductor layer 158 may be any of the impurities previously discussed. The semiconductor layer 158 may have an n-type impurity concentration in a range of about $5 \times 10^{16}$ atoms per $cm^3$ to about $1 \times 10^{17}$ atoms per $cm^3$ in the p-type region 50P. The semiconductor layer 158 may have a p-type impurity concentration in a range of about $5 \times 10^{16}$ atoms per $cm^3$ to about $1 \times 10^{17}$ atoms per $cm^3$ in the n-type region 50N.

Figure 8:
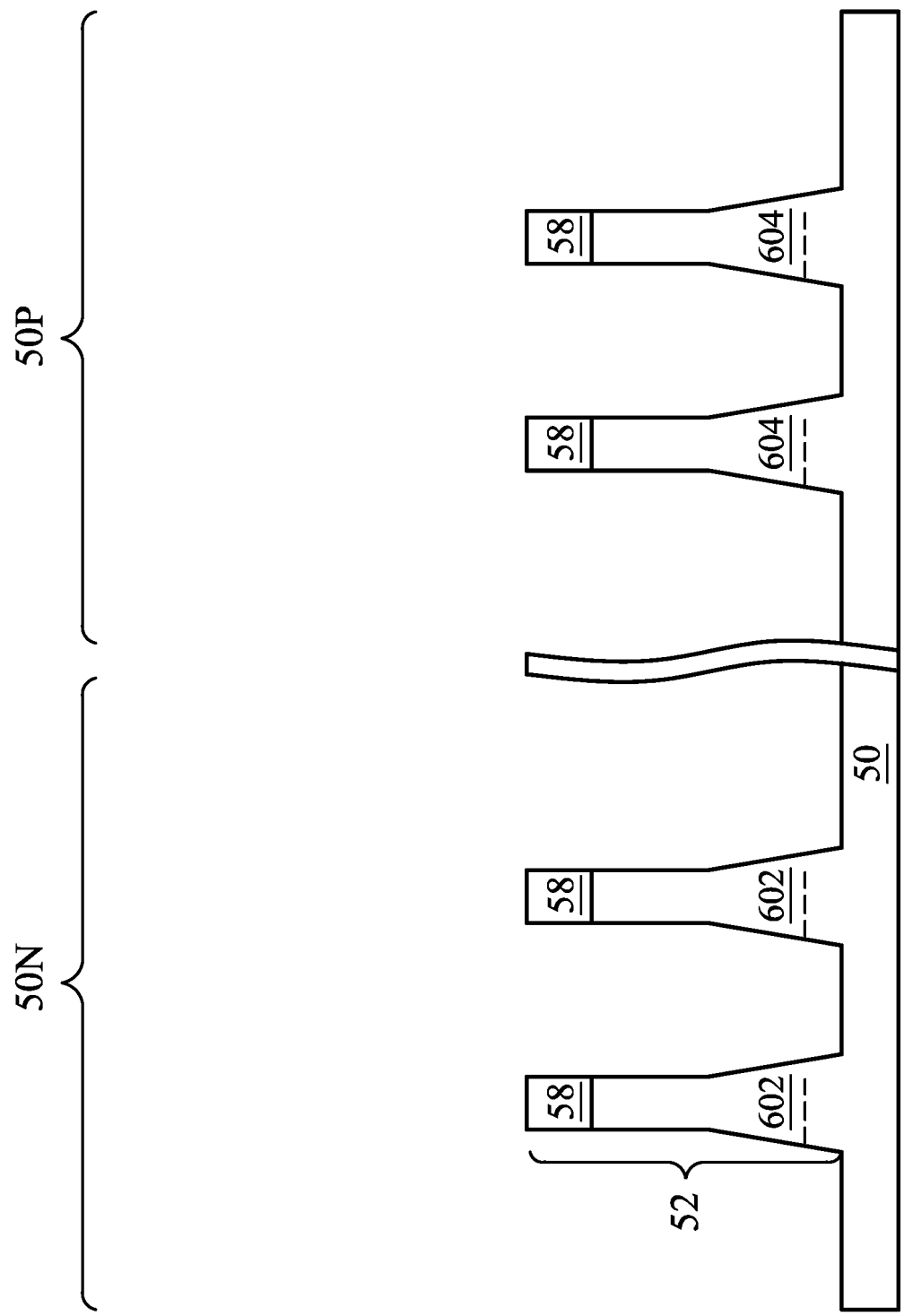

In FIG. 8, fins 52 are formed in the semiconductor layer 158 and the substrate 50. The fins 52 are semiconductor strips and may comprise channel regions 58 formed from the semiconductor layer 158. In some embodiments, the channel regions 58 have heights in a range of about 40 nm to about 60 nm. In some embodiments, the fins 52 may be formed in the semiconductor layer 158 and the substrate 50 by etching trenches through the semiconductor layer 158 and into the substrate 50. The etching may be any acceptable etch process, such as a reactive ion etch (RIE), neutral beam etch (NBE), the like, or a combination thereof. The etch may be anisotropic.

The fins may be patterned by any suitable method. For example, the fins 52 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins. In some embodiments, the mask (or other layer) may remain on the fins 52.

After patterning the fins 52 and the channel regions 58, the channel regions 58, the P wells 602, and the N wells 604 may have different concentrations of dopants. The dopant concentration of p-type dopants, such as boron, and of n-type dopants, such as phosphorus, in the channel regions 58 formed from the semiconductor layer 158 may be in a range of about $5 \times 10^{16}$ atoms per $cm^3$ to about $1 \times 10^{17}$ atoms per $cm^3$. The dopant concentration of p-type dopants such as boron in the P wells 602 may be in a range of about $10^{18}$ atoms per $cm^3$ to about $10^{19}$ atoms per $cm^3$. The dopant concentration of n-type dopants such as phosphorus in the N wells 604 may be in a range of about $10^{18}$ atoms per $cm^3$ to about $10^{19}$ atoms per $cm^3$.

Figure 9:
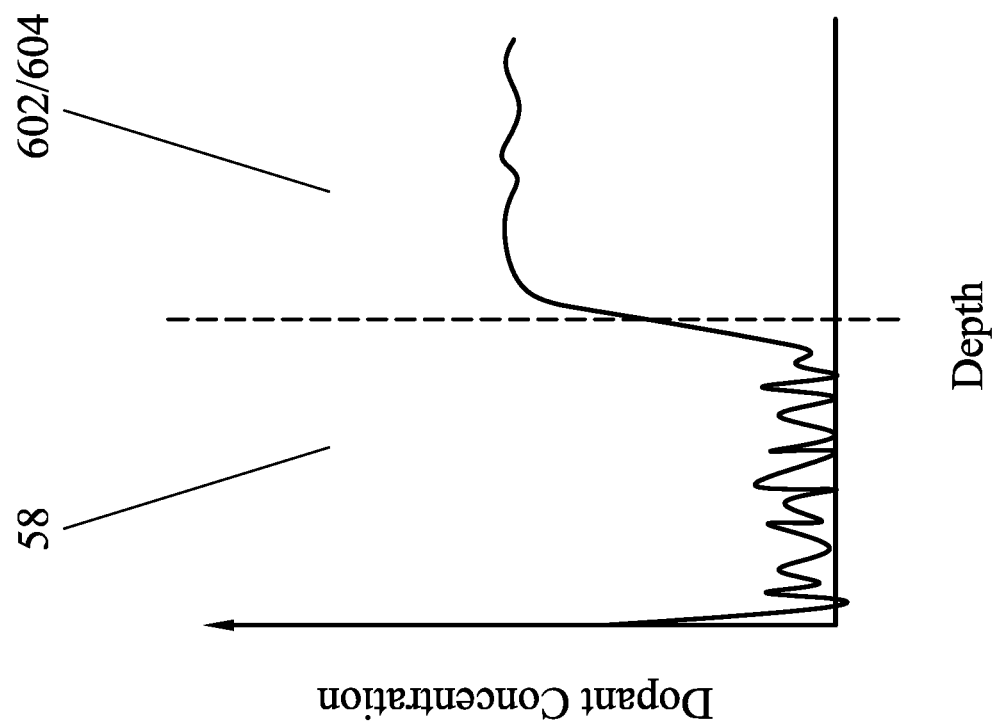
FIG. 9 illustrates concentrations of dopants in portions of a FinFET, in accordance with some embodiments.

FIG. 9 illustrates dopant concentration plotted against depth in the fins 52, in accordance with some embodiments. As illustrated, in some embodiments, the dopant concentration may have a p-type impurity gradient across the boundary between the channel regions 58 and the P wells 602 and/or an n-type impurity gradient across the boundary between the channel regions 58 and the N wells 604. For example, the p-type dopant concentration may change at a rate in a range of about $8 \times 10^{17}$ atoms per $cm^3$ per nm to about $2 \times 10^{18}$ atoms per $cm^3$ per nm across the boundary between the channel regions 58 and the P wells 602, and the n-type dopant concentration may change at a rate in a range of about $2 \times 10^{17}$ atoms per $cm^3$ per nm to about $4 \times 10^{17}$ atoms per $cm^3$ per nm across the boundary between the channel regions 58 and the N wells 604.

Figure 10:
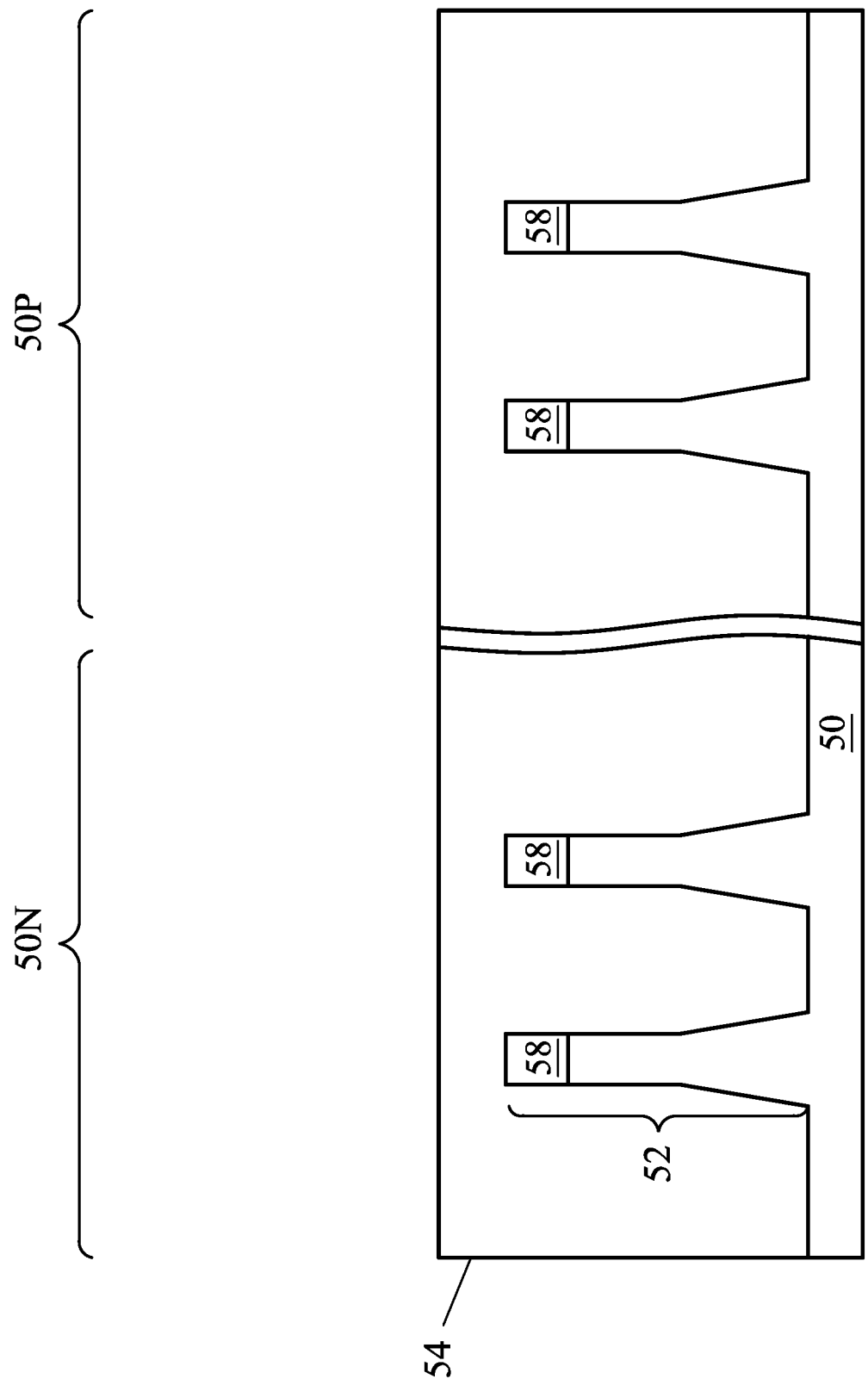

In FIG. 10, an insulation material 54 is formed over the substrate 50 and between neighboring fins 52. The insulation material 54 may be an oxide, such as silicon oxide, a nitride, the like, or a combination thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or a combination thereof. Other insulation materials formed by any acceptable process may be used. In the illustrated embodiment, the insulation material 54 is silicon oxide formed by a FCVD process. An anneal process may be performed once the insulation material is formed. In an embodiment, the insulation material 54 is formed such that excess insulation material 54 covers the fins 52. Although the insulation material 54 is illustrated as a single layer, some embodiments may utilize multiple layers. For example, in some embodiments a liner (not shown) may first be formed along a surface of the substrate 50 and the fins 52. Thereafter, a fill material, such as those discussed above may be formed over the liner.

Figure 11:
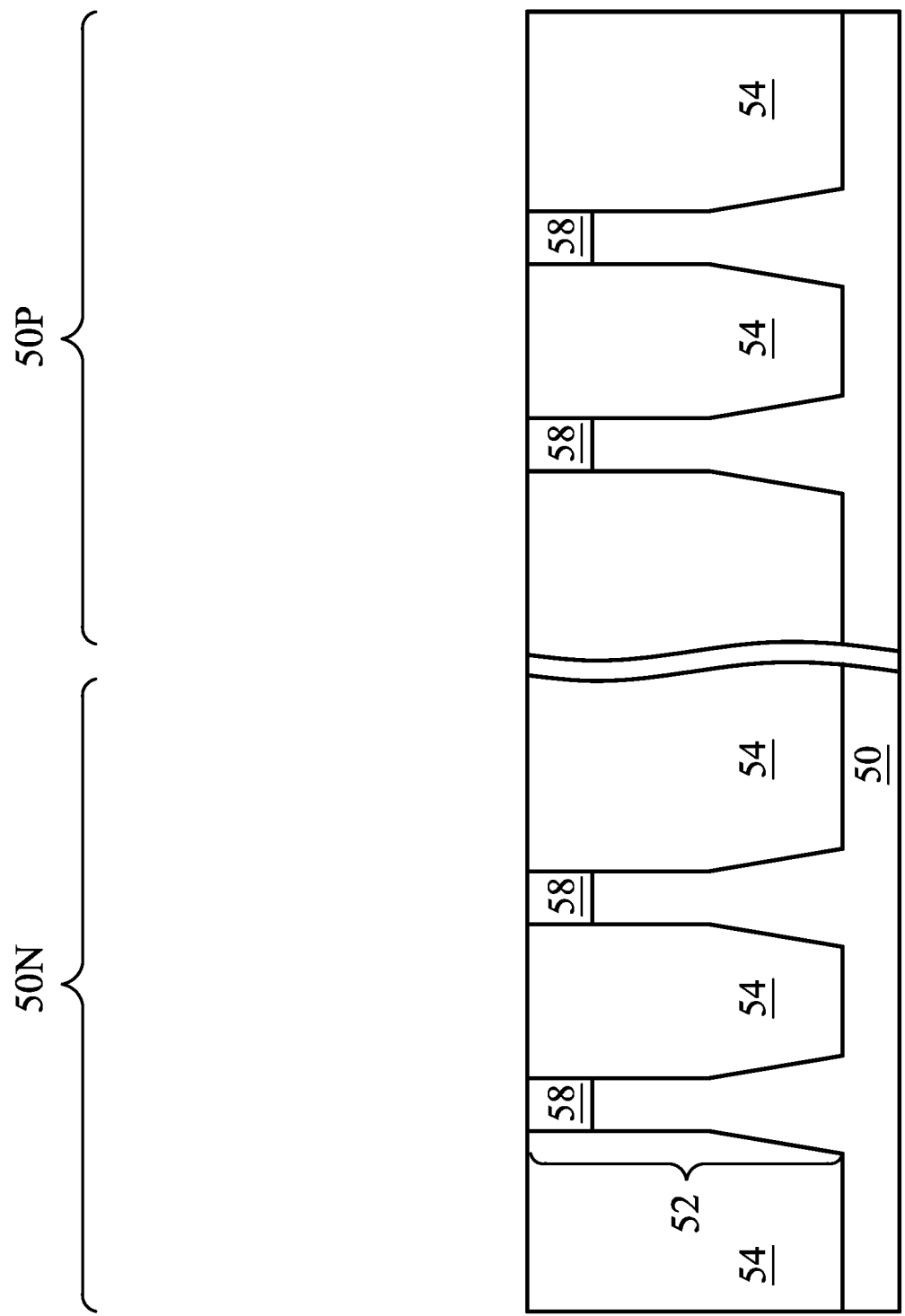

In FIG. 11, a removal process is applied to the insulation material 54 to remove excess insulation material 54 over the fins 52. In some embodiments, a planarization process such as a chemical mechanical polish (CMP), an etch-back process, combinations thereof, or the like may be utilized. The planarization process exposes the fins 52 such that top surfaces of the channel regions 58 of the fins 52 and the insulation material 54 are level after the planarization process is complete. In embodiments in which a mask remains on the fins 52, the planarization process may expose the mask or remove the mask such that top surfaces of the mask or the fins 52, respectively, and the insulation material 54 are level after the planarization process is complete.

Figure 12A:
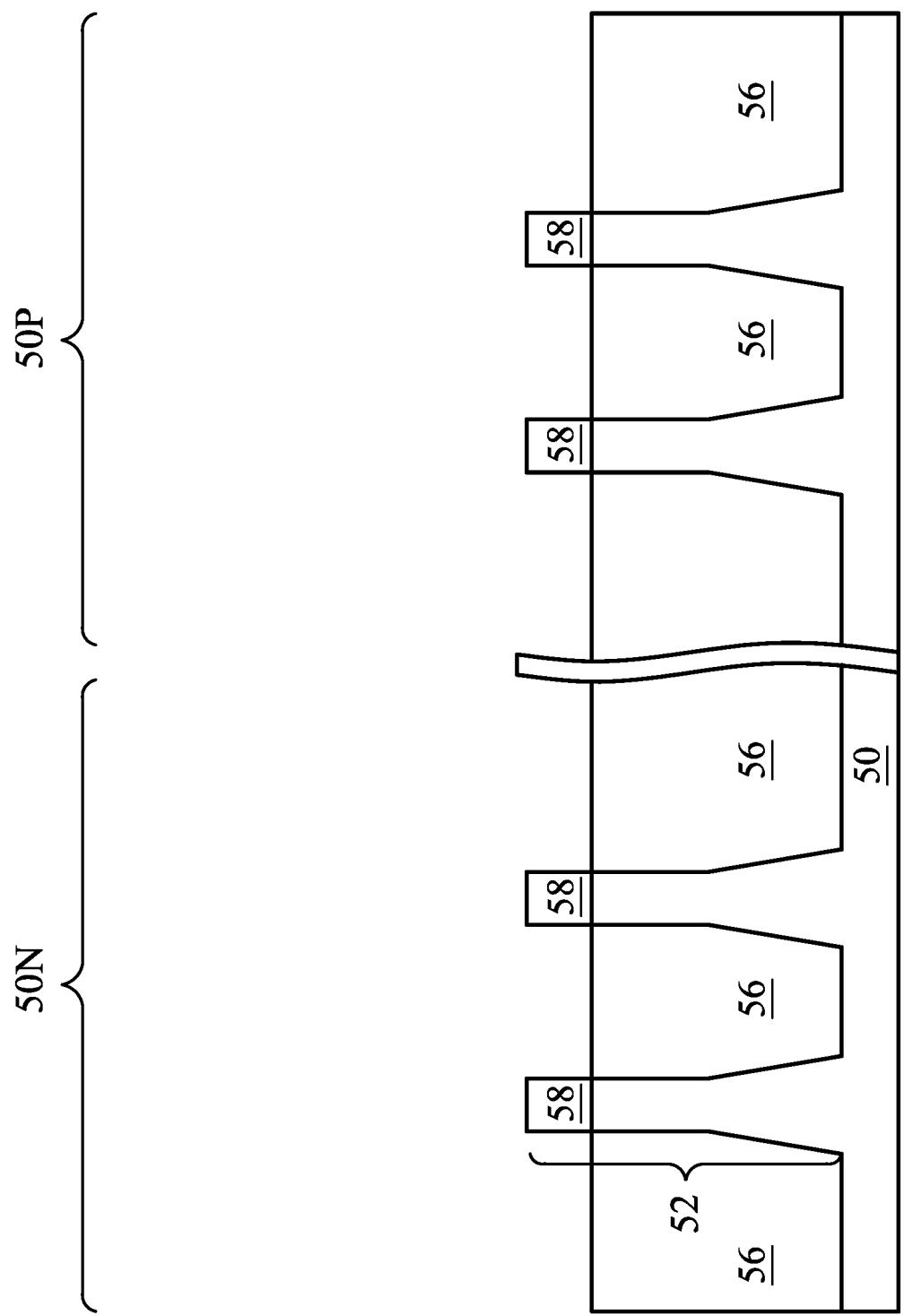
Figure 12B:
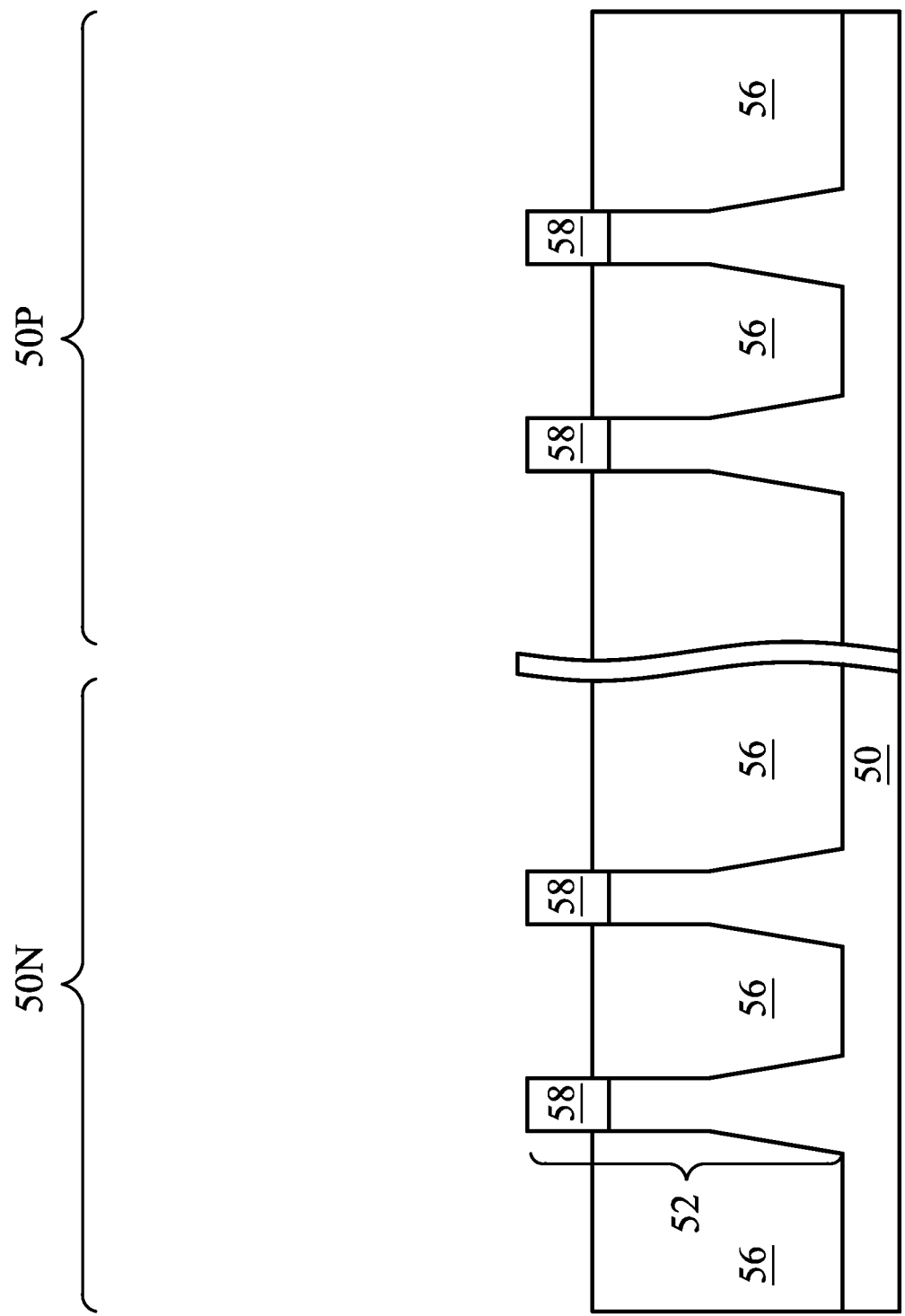

In FIGS. 12A and 12B, the insulation material 54 is recessed to form Shallow Trench Isolation (STI) regions 56. The insulation material 54 is recessed such that upper portions of fins 52, such as the channel regions 58, in the n-type region 50N and in the p-type region 50P protrude from between neighboring STI regions 56. Further, the top surfaces of the STI regions 56 may have a flat surface as illustrated, a convex surface, a concave surface (such as dishing), or a combination thereof. The top surfaces of the STI regions 56 may be formed flat, convex, and/or concave by an appropriate etch. The STI regions 56 may be recessed using an acceptable etching process, such as one that is selective to the material of the insulation material 54 (e.g., etches the material of the insulation material 54 at a faster rate than the material of the fins 52). For example, an oxide removal using, for example, dilute hydrofluoric (dHF) acid may be used. FIG. 12A illustrates the STI regions 56 being recessed so that top surfaces of the STI regions 56 are level with bottom surfaces of the channel regions 58, in accordance with some embodiments. FIG. 12B illustrates the STI regions 56 being recessed so that top surfaces of the STI regions 56 are higher than bottom surfaces of the channel regions 58, in accordance with other embodiments. Subsequent figures are illustrated as following from FIG. 12B, but the scope of the disclosed embodiments also includes embodiments following from FIG. 12A where the STI regions 56 are recessed so that top surfaces of the STI regions 56 are level with bottom surfaces of the channel regions 58. In still other embodiments (not illustrated), the STI regions 56 may be recessed so that top surfaces of the STI regions 56 are lower than bottom surfaces of the channel regions 58.

Figure 13:
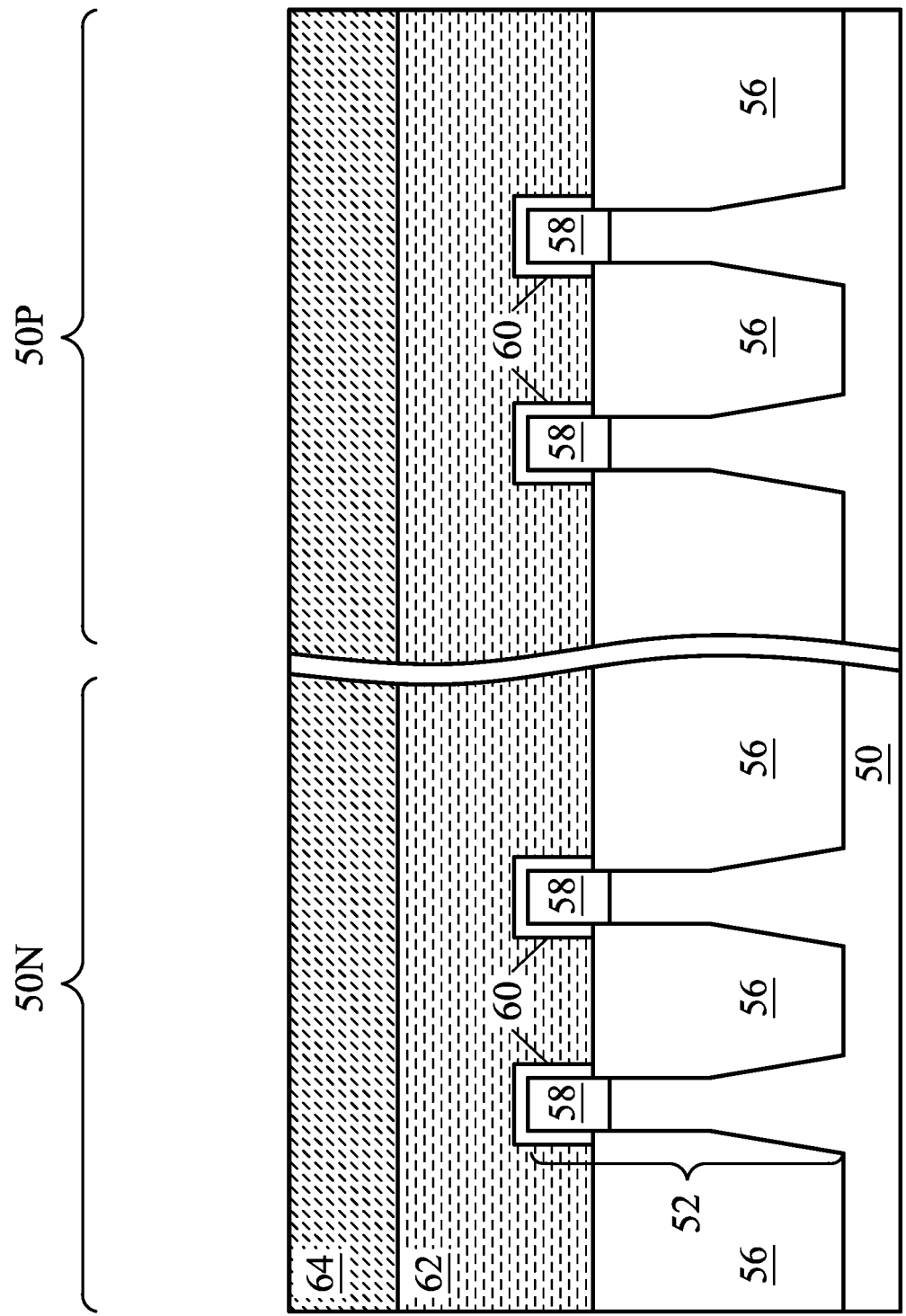

In FIG. 13, a dummy dielectric layer 60 is formed on the fins 52. The dummy dielectric layer 60 may be, for example, silicon oxide, silicon nitride, a combination thereof, or the like, and may be deposited or thermally grown according to acceptable techniques. A dummy gate layer 62 is formed over the dummy dielectric layer 60, and a mask layer 64 is formed over the dummy gate layer 62. The dummy gate layer 62 may be deposited over the dummy dielectric layer 60 and then planarized, such as by a CMP. The mask layer 64 may be deposited over the dummy gate layer 62. The dummy gate layer 62 may be a conductive or non-conductive material and may be selected from a group including amorphous silicon, polycrystalline-silicon (polysilicon), poly-crystalline silicon-germanium (poly-SiGe), metallic nitrides, metallic silicides, metallic oxides, and metals. The dummy gate layer 62 may be deposited by physical vapor deposition (PVD), CVD, sputter deposition, or other techniques for depositing the selected material. The dummy gate layer 62 may be made of other materials that have a high etching selectivity from the etching of isolation regions, e.g., the STI regions 56 and/or the dummy dielectric layer 60. The mask layer 64 may include one or more layers of, for example, silicon nitride, silicon oxynitride, or the like. In this example, a single dummy gate layer 62 and a single mask layer 64 are formed across the n-type region 50N and the p-type region 50P. It is noted that the dummy dielectric layer 60 is shown covering only the fins 52 for illustrative purposes only. In some embodiments, the dummy dielectric layer 60 may be deposited such that the dummy dielectric layer 60 covers the STI regions 56, extending over the STI regions and between the dummy gate layer 62 and the STI regions 56.

FIGS. 14A through 22B illustrate various additional steps in the manufacturing of embodiment devices. FIGS. 14A through 22B illustrate features in either of the n-type region 50N and the p-type region 50P. For example, the structures illustrated in FIGS. 14A through 22B may be applicable to both the n-type region 50N and the p-type region 50P. Differences (if any) in the structures of the n-type region 50N and the p-type region 50P are described in the text accompanying each figure.

Figure 14B:
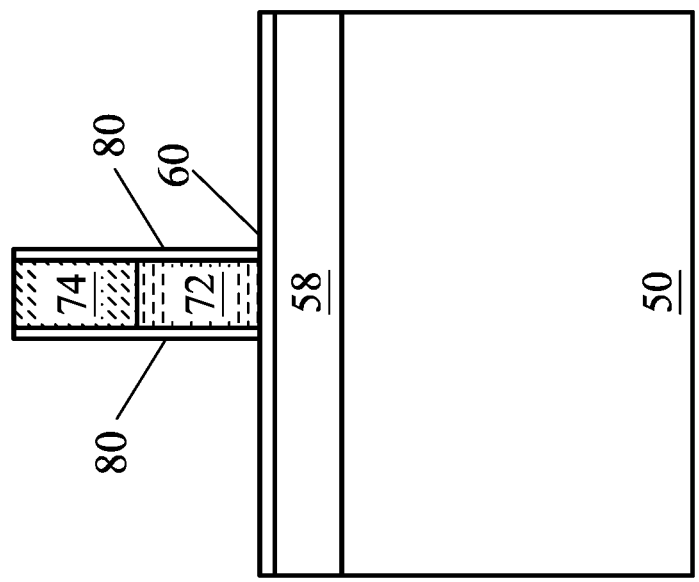
Figure 14A:
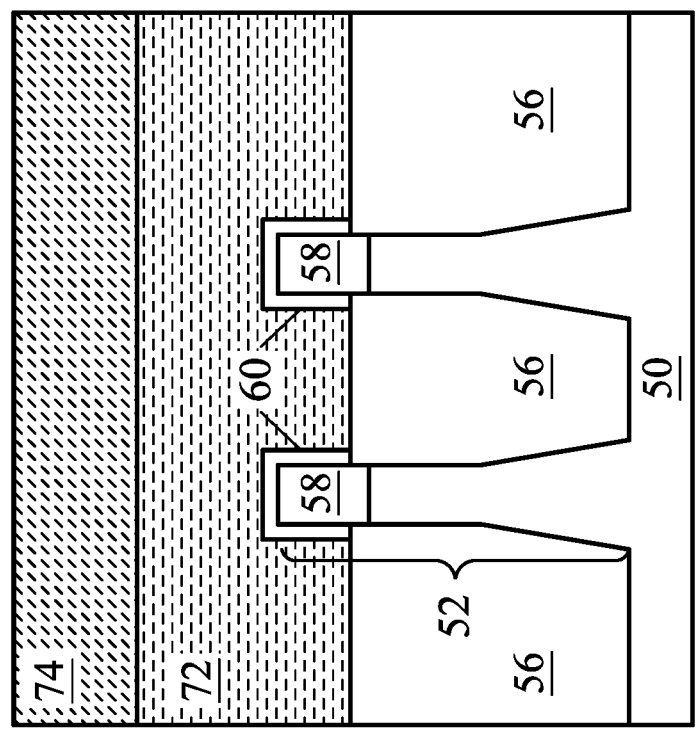

In FIGS. 14A and 14B, the mask layer 64 (see FIG. 13) may be patterned using acceptable photolithography and etching techniques to form masks 74. The pattern of the masks 74 then may be transferred to the dummy gate layer 62. In some embodiments (not illustrated), the pattern of the masks 74 may also be transferred to the dummy dielectric layer 60 by an acceptable etching technique to form dummy gates 72. The dummy gates 72 cover respective channel regions 58 of the fins 52. The pattern of the masks 74 may be used to physically separate each of the dummy gates 72 from adjacent dummy gates. The dummy gates 72 may also have a lengthwise direction substantially perpendicular to the lengthwise direction of respective epitaxial fins 52.

Further in FIGS. 14A and 14B, gate seal spacers 80 can be formed on exposed surfaces of the dummy gates 72, the masks 74, and/or the fins 52. A thermal oxidation or a deposition followed by an anisotropic etch may form the gate seal spacers 80. The gate seal spacers 80 may be formed of silicon oxide, silicon nitride, silicon oxynitride, or the like.

After the formation of the gate seal spacers 80, implants for lightly doped source/drain (LDD) regions (not explicitly illustrated) may be performed. In the embodiments with different device types, similar to the implants discussed above in FIGS. 4 and 5, a mask, such as a photoresist, may be formed over the n-type region 50N, while exposing the p-type region 50P, and appropriate type (e.g., p-type) impurities may be implanted into the exposed fins 52 in the p-type region 50P. The mask may then be removed. Subsequently, a mask, such as a photoresist, may be formed over the p-type region 50P while exposing the n-type region 50N, and appropriate type impurities (e.g., n-type) may be implanted into the exposed fins 52 in the n-type region 50N. The mask may then be removed. The n-type impurities may be the any of the n-type impurities previously discussed, and the p-type impurities may be the any of the p-type impurities previously discussed. The lightly doped source/drain regions may have a concentration of impurities of from about $10^{15}$ cm$^{-3}$ to about $10^{19}$ cm$^{-3}$. An anneal may be used to repair implant damage and to activate the implanted impurities.

Figure 15B:
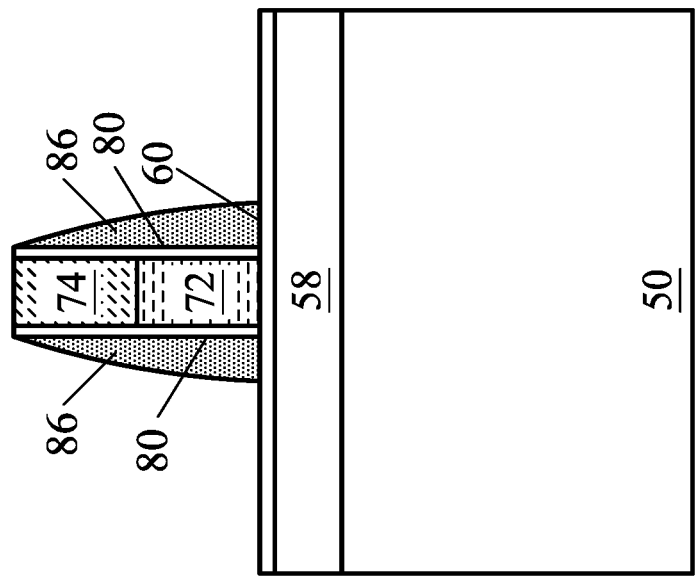
Figure 15A:
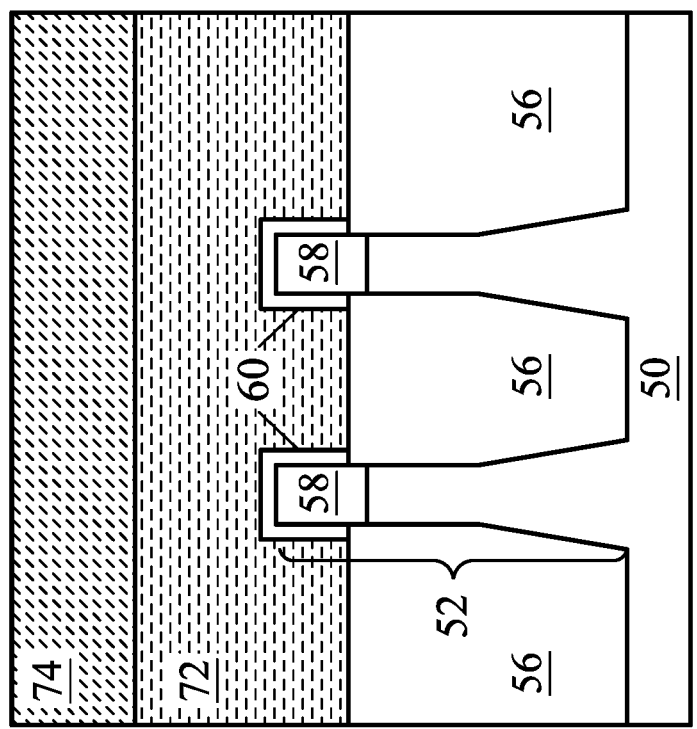

In FIGS. 15A and 15B, gate spacers 86 are formed on the gate seal spacers 80 along sidewalls of the dummy gates 72 and the masks 74. The gate spacers 86 may be formed by conformally depositing an insulating material and subsequently anisotropically etching the insulating material. The insulating material of the gate spacers 86 may be silicon oxide, silicon nitride, silicon oxynitride, silicon carbonitride, a combination thereof, or the like.

It is noted that the above disclosure generally describes a process of forming spacers and LDD regions. Other processes and sequences may be used. For example, fewer or additional spacers may be utilized, different sequence of steps may be utilized (e.g., the gate seal spacers 80 may not be etched prior to forming the gate spacers 86, yielding "L-shaped" gate seal spacers, spacers may be formed and removed, and/or the like. Furthermore, the n-type and p-type devices may be formed using a different structures and steps. For example, LDD regions for n-type devices may be formed prior to forming the gate seal spacers 80 while the LDD regions for p-type devices may be formed after forming the gate seal spacers 80.

Figure 16B:
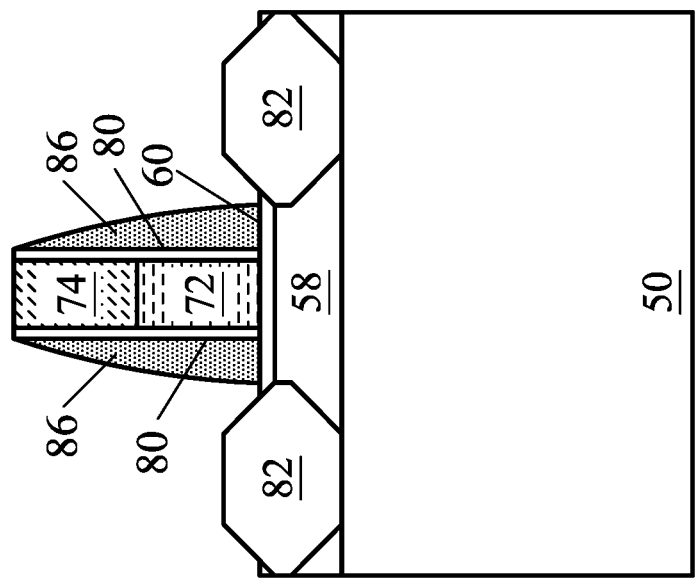
Figure 16A:
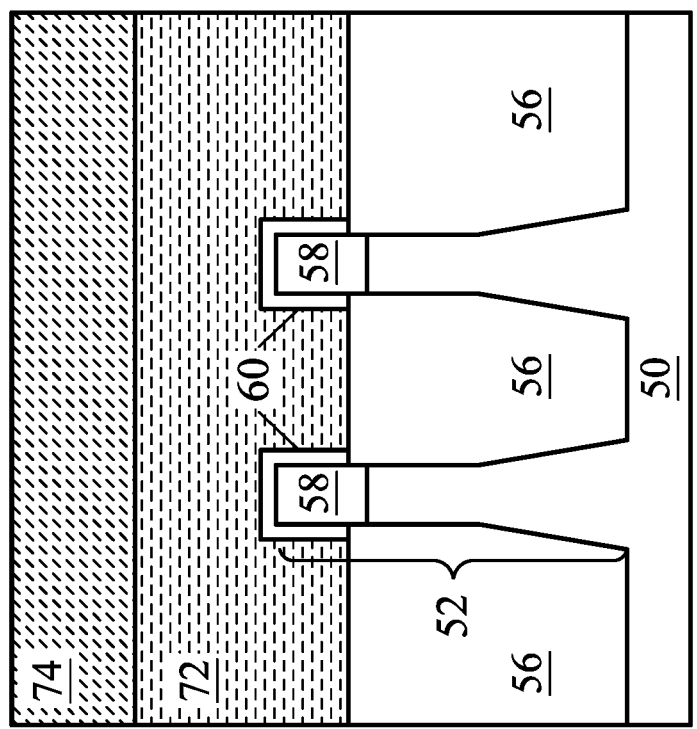
Figure 16C:
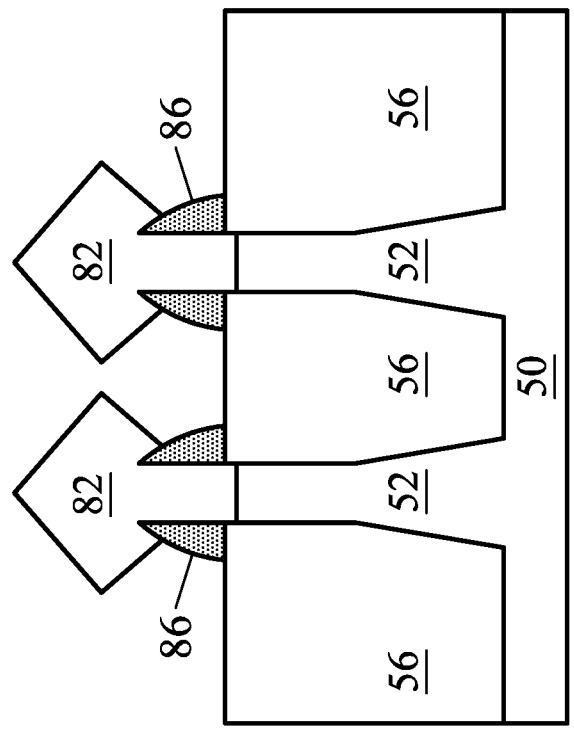
Figure 16D:
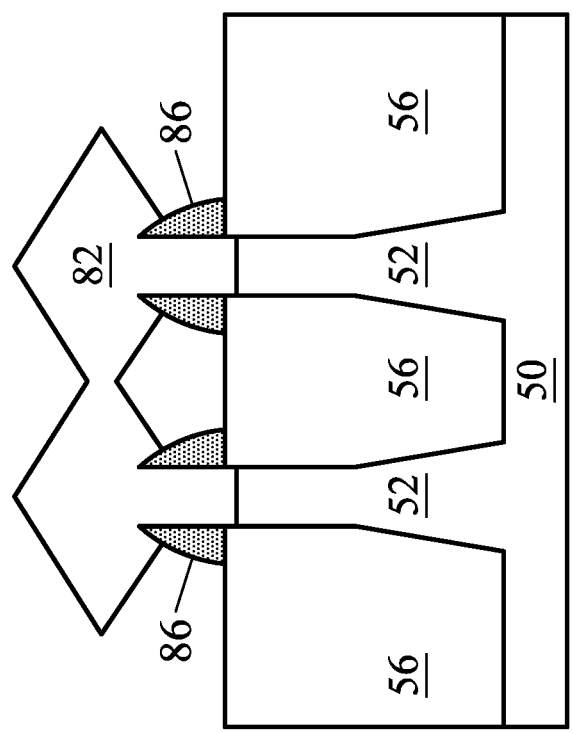

In FIGS. 16A and 16B epitaxial source/drain regions 82 are formed in the fins 52. The epitaxial source/drain regions 82 are formed in the fins 52 such that each dummy gate 72 is disposed between respective neighboring pairs of the epitaxial source/drain regions 82. In some embodiments the epitaxial source/drain regions 82 may extend into, and may also penetrate through, the fins 52. In some embodiments, the gate spacers 86 are used to separate the epitaxial source/drain regions 82 from the dummy gates 72 by an appropriate lateral distance so that the epitaxial source/drain regions 82 do not short out subsequently formed gates of the resulting FinFETs. A material of the epitaxial source/drain regions 82 may be selected to exert stress in the respective channel regions 58, thereby improving performance.

The epitaxial source/drain regions 82 in the n-type region 50N may be formed by masking the p-type region 50P and etching source/drain regions of the fins 52 in the n-type region 50N to form recesses in the fins 52. Then, the epitaxial source/drain regions 82 in the n-type region 50N are epitaxially grown in the recesses. The epitaxial source/drain regions 82 may include any acceptable material, such as appropriate for n-type FinFETs. For example, if the fin 52 is silicon, the epitaxial source/drain regions 82 in the n-type region 50N may include materials exerting a tensile strain in the channel region 58, such as silicon, silicon carbide, phosphorous doped silicon carbide, silicon phosphide, or the like. The epitaxial source/drain regions 82 in the n-type region 50N may have surfaces raised from respective surfaces of the fins 52 and may have facets.

The epitaxial source/drain regions 82 in the p-type region 50P may be formed by masking the n-type region 50N and etching source/drain regions of the fins 52 in the p-type region 50P to form recesses in the fins 52. Then, the epitaxial source/drain regions 82 in the p-type region 50P are epitaxially grown in the recesses. The epitaxial source/drain regions 82 may include any acceptable material, such as appropriate for p-type FinFETs. For example, if the fin 52 is silicon, the epitaxial source/drain regions 82 in the p-type region 50P may comprise materials exerting a compressive strain in the channel region 58, such as silicon-germanium, boron doped silicon-germanium, germanium, germanium tin, or the like. The epitaxial source/drain regions 82 in the p-type region 50P may have surfaces raised from respective surfaces of the fins 52 and may have facets.

The epitaxial source/drain regions 82 and/or the fins 52 may be implanted with dopants to form source/drain regions, similar to the process previously discussed for forming lightly-doped source/drain regions, followed by an anneal. The source/drain regions may have an impurity concentration of between about $10^{19}$ cm$^{-3}$ and about $10^{21}$ cm$^{-3}$. The n-type and/or p-type impurities for source/drain regions may be any of the impurities previously discussed. In some embodiments, the epitaxial source/drain regions 82 may be in situ doped during growth.

As a result of the epitaxy processes used to form the epitaxial source/drain regions 82 in the n-type region 50N and the p-type region 50P, upper surfaces of the epitaxial source/drain regions have facets which expand laterally outward beyond sidewalls of the fins 52. In some embodiments, these facets cause adjacent source/drain regions 82 of a same FinFET to merge as illustrated by FIG. 16C. In other embodiments, adjacent source/drain regions 82 remain separated after the epitaxy process is completed as illustrated by FIG. 16D. In the embodiments illustrated in FIGS. 16C and 16D, gate spacers 86 are formed covering a portion of the sidewalls of the fins 52 that extend above the STI regions 56 thereby blocking the epitaxial growth. In some other embodiments, the spacer etch used to form the gate spacers 86 may be adjusted to remove the spacer material to allow the epitaxially grown region to extend to the surface of the STI region 56.

In FIGS. 17A and 17B, a first interlayer dielectric (ILD) 88 is deposited over the structure illustrated in FIGS. 16A and 16B. The first ILD 88 may be formed of a dielectric material, and may be deposited by any suitable method, such as CVD, plasma-enhanced CVD (PECVD), or FCVD. Dielectric materials may include phospho-silicate glass (PSG), boro-silicate glass (BSG), boron-doped phospho-silicate glass (BPSG), undoped silicate glass (USG), or the like. Other insulation materials formed by any acceptable process may be used. In some embodiments, a contact etch stop layer (CESL) 87 is disposed between the first ILD 88 and the epitaxial source/drain regions 82, the masks 74, and the gate spacers 86. The CESL 87 may comprise a dielectric material, such as, silicon nitride, silicon oxide, silicon oxynitride, or the like, having a lower etch rate than the material of the overlying first ILD 88.

Figure 18B:
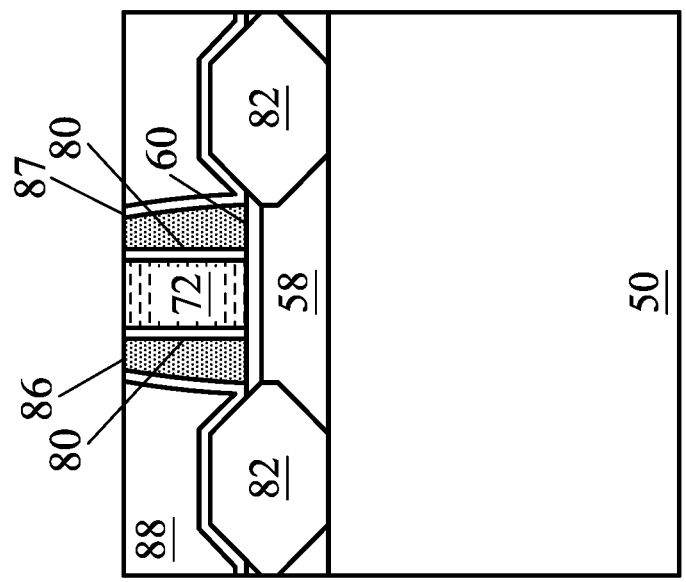
Figure 18A:
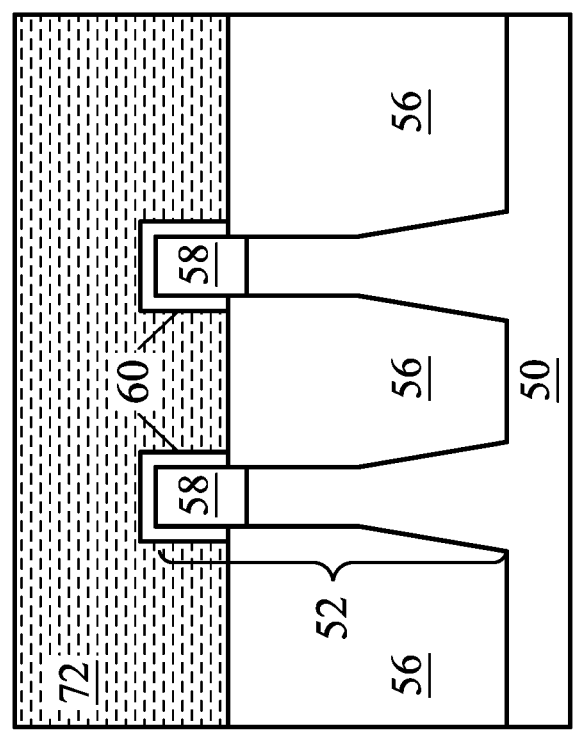

In FIGS. 18A and 18B, a planarization process, such as a CMP, may be performed to level the top surface of the first ILD 88 with the top surfaces of the dummy gates 72 or the masks 74. The planarization process may also remove the masks 74 on the dummy gates 72, and portions of the gate seal spacers 80 and the gate spacers 86 along sidewalls of the masks 74. After the planarization process, top surfaces of the dummy gates 72, the gate seal spacers 80, the gate spacers 86, and the first ILD 88 are level. Accordingly, the top surfaces of the dummy gates 72 are exposed through the first ILD 88. In some embodiments, the masks 74 may remain, in which case the planarization process levels the top surface of the first ILD 88 with the top surfaces of the top surface of the masks 74.

Figure 19B:
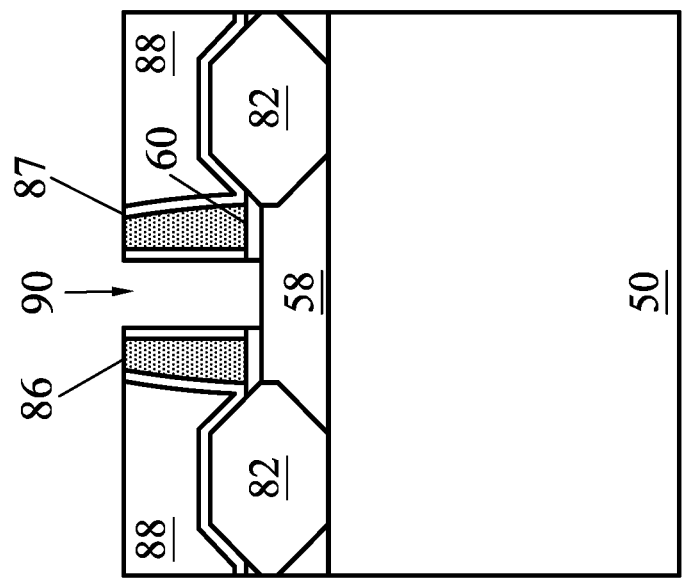
Figure 19A:
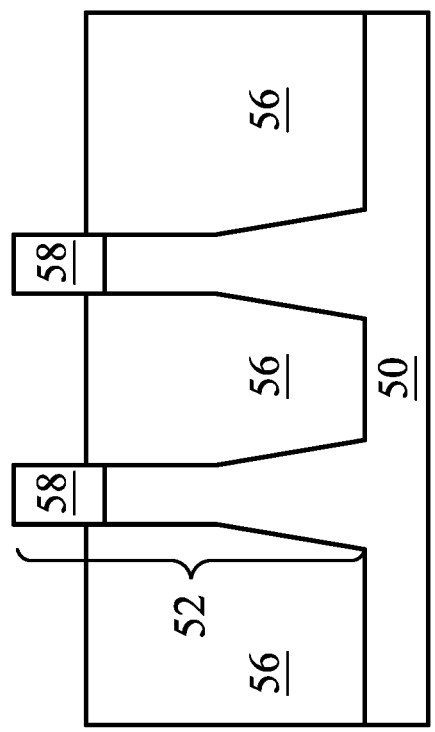

In FIGS. 19A and 19B, the dummy gates 72, and the masks 74 if present, are removed in an etching step(s), so that recesses 90 are formed. Portions of the dummy dielectric layer 60 in the recesses 90 may also be removed. In some embodiments, only the dummy gates 72 are removed and the dummy dielectric layer 60 remains and is exposed by the recesses 90. In some embodiments, the dummy dielectric layer 60 is removed from recesses 90 in a first region of a die (e.g., a core logic region) and remains in recesses 90 in a second region of the die (e.g., an input/output region). In some embodiments, the dummy gates 72 are removed by an anisotropic dry etch process. For example, the etching process may include a dry etch process using reaction gas(es) that selectively etch the dummy gates 72 with little or no etching of the first ILD 88 or the gate spacers 86. Each recess 90 exposes and/or overlies a channel region 58 of a respective fin 52. Each channel region 58 is disposed between neighboring pairs of the epitaxial source/drain regions 82. During the removal, the dummy dielectric layer 60 may be used as an etch stop layer when the dummy gates 72 are etched. The dummy dielectric layer 60 may then be optionally removed after the removal of the dummy gates 72.

Figure 20B:
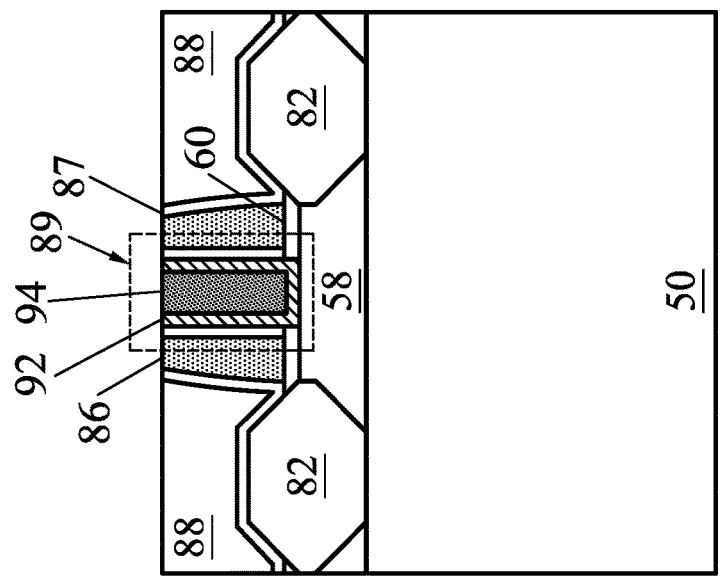
Figure 20A:
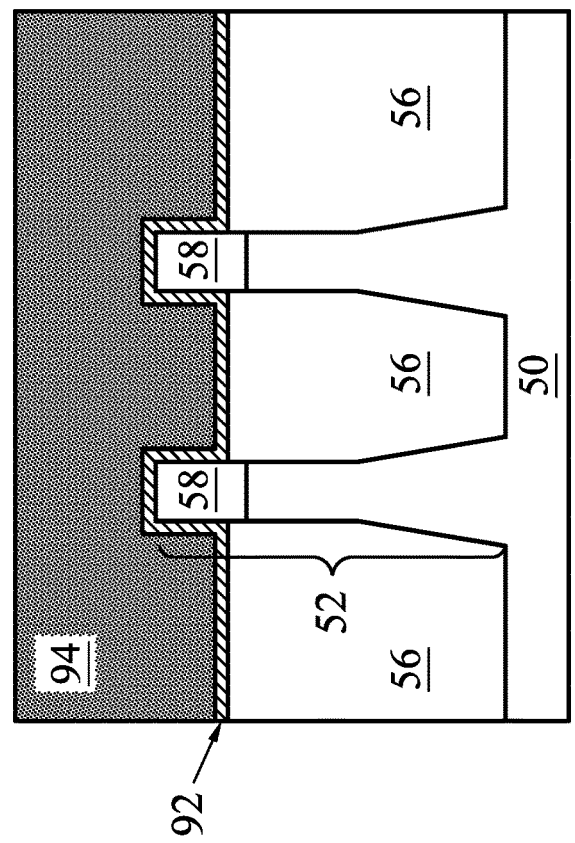
Figure 20C:
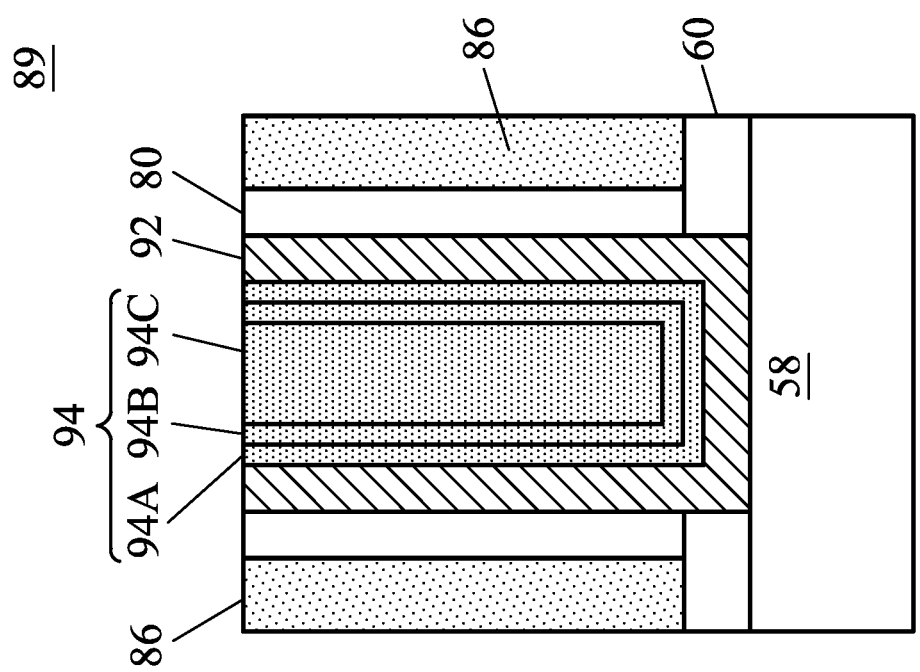

In FIGS. 20A and 20B, gate dielectric layers 92 and gate electrodes 94 are formed for replacement gates. FIG. 20C illustrates a detailed view of region 89 of FIG. 20B. Gate dielectric layers 92 include one or more layers deposited in the recesses 90, such as on the top surfaces and the sidewalls of the fins 52 and on sidewalls of the gate seal spacers 80/gate spacers 86. The gate dielectric layers 92 may also be formed on the top surface of the first ILD 88. In some embodiments, the gate dielectric layers 92 comprise one or more dielectric layers, such as one or more layers of silicon oxide, silicon nitride, metal oxide, metal silicate, or the like. For example, in some embodiments, the gate dielectric layers 92 include an interfacial layer of silicon oxide formed by thermal or chemical oxidation and an overlying high-k dielectric material, such as a metal oxide or a silicate of hafnium, aluminum, zirconium, lanthanum, manganese, barium, titanium, lead, and combinations thereof. The gate dielectric layers 92 may include a dielectric layer having a k value greater than about 7.0. The formation methods of the gate dielectric layers 92 may include Molecular-Beam Deposition (MBD), ALD, PECVD, and the like. In embodiments where portions of the dummy gate dielectric 60 remains in the recesses 90, the gate dielectric layers 92 include a material of the dummy gate dielectric 60 (e.g., $SiO_2$).

The gate electrodes 94 are deposited over the gate dielectric layers 92, respectively, and fill the remaining portions of the recesses 90. The gate electrodes 94 may include a metal-containing material such as titanium nitride, titanium oxide, tantalum nitride, tantalum carbide, cobalt, ruthenium, aluminum, tungsten, combinations thereof, or multi-layers thereof. For example, although a single layer gate electrode 94 is illustrated in FIG. 20B, the gate electrode 94 may comprise any number of liner layers 94A, any number of work function tuning layers 94B, and a fill material 94C as illustrated by FIG. 20C. After the filling of the recesses 90, a planarization process, such as a CMP, may be performed to remove the excess portions of the gate dielectric layers 92 and the material of the gate electrodes 94, which excess portions are over the top surface of the ILD 88. The remaining portions of material of the gate electrodes 94 and the gate dielectric layers 92 thus form replacement gates of the resulting FinFETs. The gate electrodes 94 and the gate dielectric layers 92 may be collectively referred to as a "gate stack." The gate and the gate stacks may extend along sidewalls of a channel region 58 of the fins 52.

The formation of the gate dielectric layers 92 in the n-type region 50N and the p-type region 50P may occur simultaneously such that the gate dielectric layers 92 in each region are formed from the same materials, and the formation of the gate electrodes 94 may occur simultaneously such that the gate electrodes 94 in each region are formed from the same materials. In some embodiments, the gate dielectric layers 92 in each region may be formed by distinct processes, such that the gate dielectric layers 92 may be different materials, and/or the gate electrodes 94 in each region may be formed by distinct processes, such that the gate electrodes 94 may be different materials. Various masking steps may be used to mask and expose appropriate regions when using distinct processes.

Figure 21B:
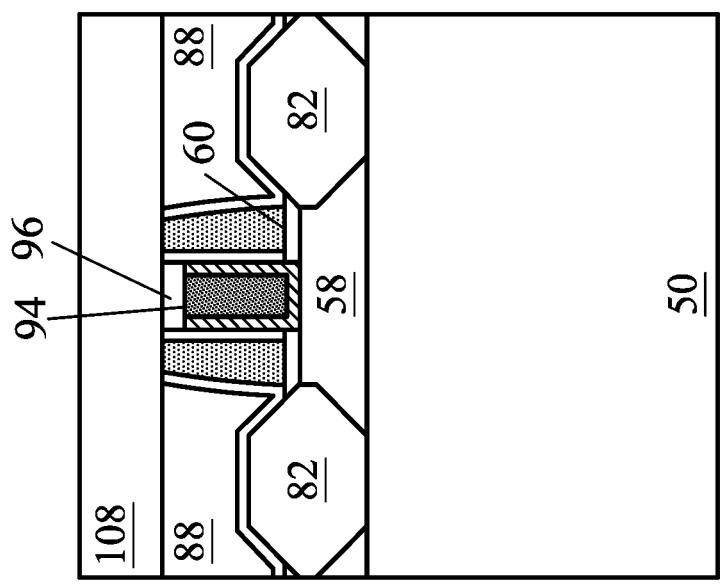
Figure 21A:
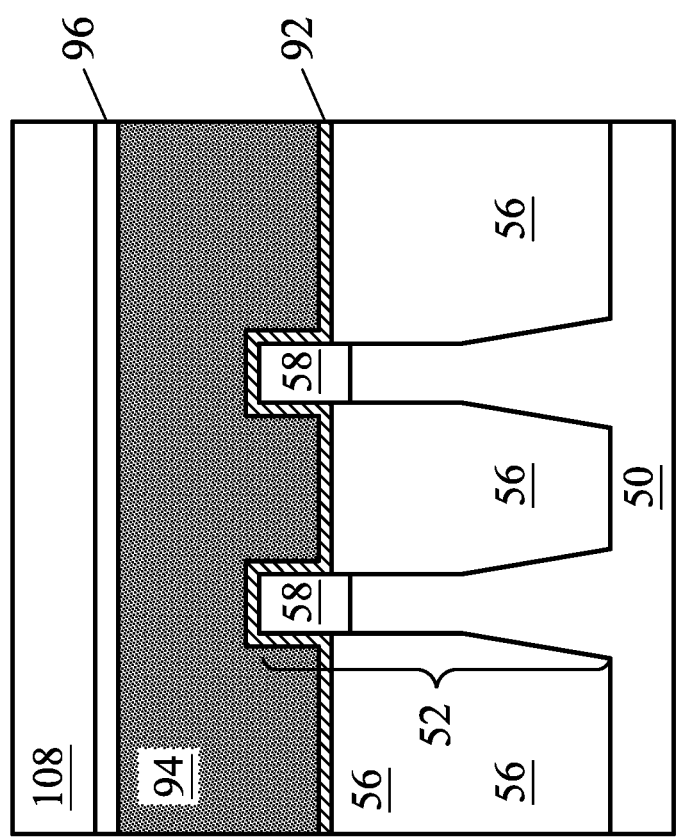

In FIGS. 21A and 21B, a gate mask 96 is formed over the gate stack (including a gate dielectric layer 92 and a corresponding gate electrode 94), and the gate mask may be disposed between opposing portions of the gate spacers 86. In some embodiments, forming the gate mask 96 includes recessing the gate stack so that a recess is formed directly over the gate stack and between opposing portions of gate spacers 86. A gate mask 96 comprising one or more layers of dielectric material, such as silicon nitride, silicon oxynitride, or the like, is filled in the recess, followed by a planarization process to remove excess portions of the dielectric material extending over the first ILD 88.

As also illustrated in FIGS. 21A and 21B, a second ILD 108 is deposited over the first ILD 88. In some embodiments, the second ILD 108 is a flowable film formed by a flowable CVD method. In some embodiments, the second ILD 108 is formed of a dielectric material such as PSG, BSG, BPSG, USG, or the like, and may be deposited by any suitable method, such as CVD and PECVD. The subsequently formed gate contacts 110 (FIGS. 22A and 22B) penetrate through the second ILD 108 and the gate mask 96 to contact the top surface of the recessed gate electrode 94.

Figure 22B:
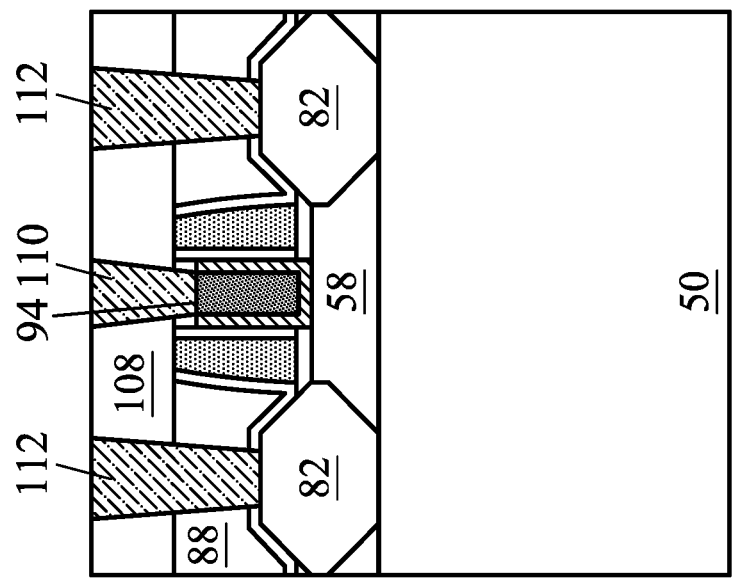
Figure 22A:
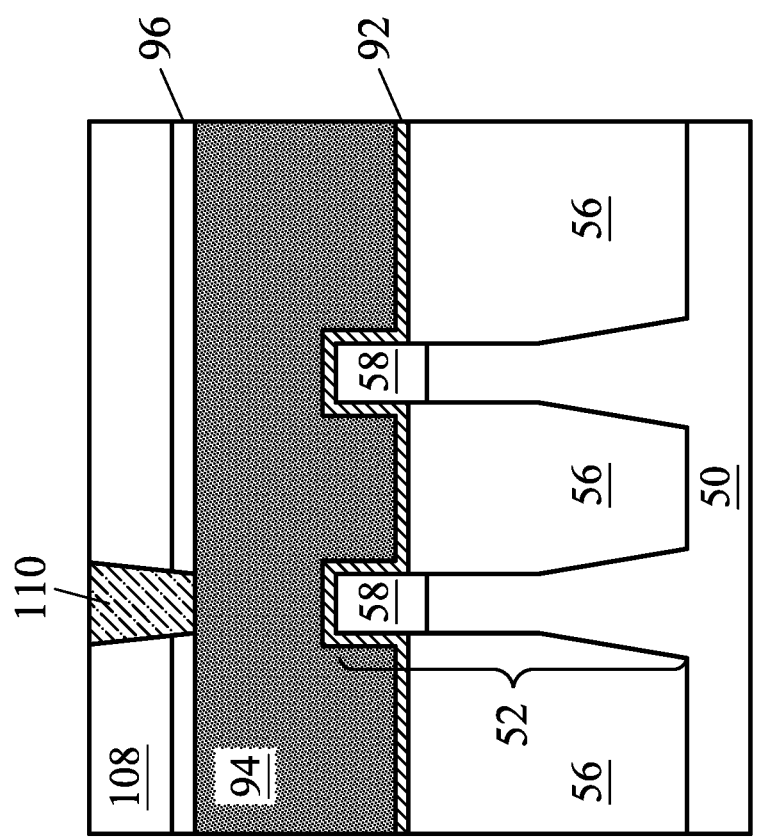

In FIGS. 22A and 22B, gate contacts 110 and source/drain contacts 112 are formed through the second ILD 108 and the first ILD 88 in accordance with some embodiments. Openings for the source/drain contacts 112 are formed through the first and second ILDs 88 and 108, and openings for the gate contact 110 are formed through the second ILD 108 and the gate mask 96. The openings may be formed using acceptable photolithography and etching techniques. A liner (not shown), such as a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from a surface of the ILD 108. The remaining liner and conductive material form the source/drain contacts 112 and gate contacts 110 in the openings. An anneal process may be performed to form a silicide at the interface between the epitaxial source/drain regions 82 and the source/drain contacts 112. The source/drain contacts 112 are physically and electrically coupled to the epitaxial source/drain regions 82, and the gate contacts 110 are physically and electrically coupled to the gate electrodes 94. The source/drain contacts 112 and gate contacts 110 may be formed in different processes, or may be formed in the same process. Although shown as being formed in the same cross-sections, it should be appreciated that each of the source/drain contacts 112 and gate contacts 110 may be formed in different cross-sections, which may avoid shorting of the contacts.

The disclosed FinFET embodiments could also be applied to nanostructure devices such as nanostructure (e.g., nanosheet, nanowire, gate-all-around, or the like) field effect transistors (NSFETs). In an NSFET embodiment, the fins are replaced by nanostructures formed by patterning a stack of alternating layers of channel layers and sacrificial layers. Dummy gate stacks and source/drain regions are formed in a manner similar to the above-described embodiments. After the dummy gate stacks are removed, the sacrificial layers can be partially or fully removed in channel regions. The replacement gate structures are formed in a manner similar to the above-described embodiments, the replacement gate structures may partially or completely fill openings left by removing the sacrificial layers, and the replacement gate structures may partially or completely surround the channel layers in the channel regions of the NSFET devices. ILDs and contacts to the replacement gate structures and the source/drain regions may be formed in a manner similar to the above-described embodiments. A nanostructure device can be formed as disclosed in U.S. Patent Application Publication No. 2016/0365414, which is incorporated herein by reference in its entirety.

Embodiments may provide advantages. Trigger voltages ($V_{trigger}$) of transistors, such as MOSFETs, of greater than about 1.7 V may be achieved by reducing well resistance and isolation leakage current, such as from highly doped source/drain regions to well regions. This reduction of isolation leakage current and well resistance may be accomplished by forming well regions with higher doses of implanted impurities. Performing implants of heavy species of dopants at hot temperatures, for example, greater than about 150° C. may be useful for preventing/reducing point defects, which may further prevent/reduce the formation of substrate extended defects during subsequent thermal processing and improve mobility in subsequently formed epitaxial channel regions. In some embodiments, it may be advantageous to form a mask layer such as a pad oxide or nitride covering the substrate prior to the implantation to reduce outgassing and residuals from photoresists used during the implanting.

In accordance with an embodiment, a method of forming a semiconductor device includes: implanting dopants of a first conductivity type into a semiconductor substrate to form a first well, the semiconductor substrate including a first semiconductor material, implanting the dopants of the first conductivity type being performed at a temperature in a range of 150° C. to 500° C.; epitaxially growing a channel layer over the semiconductor substrate, the channel layer including a second semiconductor material, the channel layer being doped with dopants of the first conductivity type; forming a fin from the second semiconductor material; and forming a gate structure over a channel region of the fin and forming source/drain regions over the fin on opposing sides of the channel region, the source/drain regions being doped with dopants of a second conductivity type. In an embodiment, implanting the dopants of the first conductivity type is performed at a temperature in a range of 300° C. to 500° C. In an embodiment, the dopants of the first conductivity type are n-type dopants. In an embodiment, the dopants of the first conductivity type include arsenic or phosphorus. In an embodiment, the second semiconductor material is different from the first semiconductor material. In an embodiment, a concentration of dopants of the first conductivity type in the channel region is in a range of $5 \times 10^{16}$ atoms/cm$^3$ to $10^{17}$ atoms/cm$^3$. In an embodiment, a concentration of the dopants of the first conductivity type in the first well is in a range of $10^{18}$ atoms/cm$^3$ and $10^{19}$ atoms/cm$^3$. In an embodiment, implanting dopants of the first conductivity type includes implanting at a dose in a range of $1.5 \times 10^{14}$ cm$^{-2}$ to $3.0 \times 10^{14}$ cm$^{-2}$.

In accordance with another embodiment, a method of forming a semiconductor device includes: forming a first mask over a first region and a second region of a substrate; forming a second mask over the first mask in the first region of the substrate; implanting a first dopant in the second region with a dose in a range of $1.5 \times 10^{14}$ cm$^{-2}$ to $3.0 \times 10^{14}$ cm$^{-2}$ to form a first well, the implanting being performed at a temperature in a range of 170° C. to 500° C., wherein the implanting is performed by driving the first dopant through the first mask; removing the second mask; removing the first mask; and forming a first fin in the first region and forming a second fin in the second region. In an embodiment, the first mask includes an oxide or a nitride. In an embodiment, the first dopant is implanted in the first well to a depth in a range of 20 nm to 600 nm from the surface of the first well. In an embodiment, a concentration of the first dopant changes at a rate in a range of $8 \times 10^{17}$ atoms per cm$^3$ per nm to $2 \times 10^{18}$ atoms per cm$^3$ per nm across a boundary between the first well and the second fin. In an embodiment, the first dopant is arsenic or phosphorus. In an embodiment, the first well includes point defects at an area density of less than $5 \times 10^7$ cm$^{-2}$. In an embodiment, a concentration of the first dopant in the first well is in a range of $10^{18}$ atoms/cm$^3$ and $10^{19}$ atoms/cm$^3$.

In accordance with yet another embodiment, a semiconductor device includes: a first fin extending from a semiconductor substrate, the first fin including a first well, the first well having a first dopant with a concentration in a range of $10^{17}$ atoms/cm$^3$ to $10^{19}$ atoms/cm$^3$, the first well having substrate defects with an area density in a range of $1.0 \times 10^7$ cm$^{-2}$ to $5.0 \times 10^7$ cm$^{-2}$; a channel region on the first well, wherein the concentration of the first dopant changes at a rate in a range of $8 \times 10^{17}$ atoms per cm$^3$ per nm to $2 \times 10^{18}$ atoms per cm$^3$ per nm from the first well to the channel region; a first source/drain region and a second source/drain region, the first source/drain region and the second source/drain region extending from the first fin; and a first gate electrode over the first fin. In an embodiment, the semiconductor device further includes a second fin extending from the semiconductor substrate, the second fin including a second well, the second well having a second dopant, the second dopant being different from the first dopant. In an embodiment, the first dopant is an n-type dopant and the second dopant is a p-type dopant. In an embodiment, the first dopant is phosphorus or arsenic. In an embodiment, the second dopant is boron difluoride. In an embodiment, the second dopant is indium. In an embodiment, n the channel region includes a layer of silicon-germanium, and the first dopant extends to a depth in a range of 20 nm to 600 nm below the layer of silicon-germanium.

In accordance with yet another embodiment, a semiconductor device includes: a semiconductor fin, the semiconductor fin including a first well, the first well including: a first dopant with a concentration in a range of $10^{17}$ atoms/cm$^3$ to $10^{19}$ atoms/cm$^3$; and substrate defects with an area density in a range of $1.0 \times 10^7$ cm$^{-2}$ to $5.0 \times 10^7$ cm$^{-2}$; and a channel region over the first well; a source/drain region extending from the semiconductor fin; and a gate electrode over the semiconductor fin. In an embodiment, the first well has a depth in a range of 20 nm to 600 nm. In an embodiment, the channel region has a concentration of the first dopant in a range of $5 \times 10^{16}$ atoms/cm$^3$ to $1 \times 10^{17}$ atoms/cm$^3$. In an embodiment, the first dopant is a p-type dopant and wherein the concentration of the first dopant changes from the channel region to the first well with a gradient in a range of $8 \times 10^{17}$ atoms per cm$^3$ per nm to $2 \times 10^{18}$ atoms per cm$^3$ per nm. In an embodiment, the p-type dopant includes boron. In an embodiment, the first dopant is an n-type dopant and the concentration of the first dopant changes from the channel region to the first well with a gradient in a range of $2 \times 10^{17}$ atoms per cm$^3$ per nm to $4 \times 10^{17}$ atoms per cm$^3$ per nm. In an embodiment, the n-type dopant includes phosphorus.

In accordance with yet another embodiment, a semiconductor device includes: a first well in a semiconductor fin, the first well including a first dopant, wherein the first dopant has a concentration in a range of $10^{17}$ atoms/cm$^3$ to $10^{19}$ atoms/cm$^3$; a channel region extending from the first well, wherein the concentration of the first dopant changes at a rate in a range of $8 \times 10^{17}$ atoms per cm$^3$ per nm to $2 \times 10^{18}$ atoms per cm$^3$ per nm from the first well to the channel region; and a gate stack over the semiconductor fin. In an embodiment, the channel region includes an epitaxial layer, and wherein the first well extends to a depth below the epitaxial layer in a range of 20 nm to 600 nm. In an embodiment, the first dopant is phosphorus. In an embodiment, the first dopant is arsenic. In an embodiment, the first dopant is antimony. In an embodiment, the first well includes point defects, the point defects having an area density of less than $5 \times 10^7$ cm$^{-2}$.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A semiconductor device comprising:
   a semiconductor fin, the semiconductor fin comprising
      a first well, the first well comprising:
         a first dopant with a concentration in a range of $10^{17}$ atoms/cm$^3$ to $10^{19}$ atoms/cm$^3$; and substrate defects with an area density in a range of $1.0 \times 10^7$ cm$^{-2}$ to $5.0 \times 10^7$ cm$^{-2}$; and a channel region over the first well;

a source/drain region extending from the semiconductor fin; and a gate electrode over the semiconductor fin.

2. The semiconductor device of claim 1, wherein the first well has a depth in a range of 20 nm to 600 nm.

3. The semiconductor device of claim 1, wherein the channel region has a concentration of the first dopant in a range of $5 \times 10^{16}$ atoms/cm$^3$ to $1 \times 10^{17}$ atoms/cm$^3$.

4. The semiconductor device of claim 3, wherein the first dopant is a p-type dopant and wherein the concentration of the first dopant changes from the channel region to the first well with a gradient in a range of $8 \times 10^{17}$ atoms per cm$^3$ per nm to $2 \times 10^{18}$ atoms per cm$^3$ per nm.

5. The semiconductor device of claim 4, wherein the p-type dopant comprises boron.

6. The semiconductor device of claim 3, wherein the first dopant is an n-type dopant and wherein the concentration of the first dopant changes from the channel region to the first well with a gradient in a range of $2 \times 10^{17}$ atoms per cm$^3$ per nm to $4 \times 10^{17}$ atoms per cm$^3$ per nm.

7. The semiconductor device of claim 6, wherein the n-type dopant comprises phosphorus.

8. A semiconductor device comprising:

a first well in a semiconductor fin, the first well comprising a first dopant, wherein the first dopant has a concentration in a range of $10^{17}$ atoms/cm$^3$ to $10^{19}$ atoms/cm$^3$;

a channel region extending from the first well, wherein the concentration of the first dopant changes at a rate in a range of $2 \times 10^{17}$ atoms per cm$^3$ per nm to $4 \times 10^{17}$ atoms per cm$^3$ per nm across a boundary between the first well and the channel region; and a gate stack over the semiconductor fin.

9. The semiconductor device of claim 8, wherein the channel region comprises an epitaxial layer, and wherein the first well extends to a depth below the epitaxial layer in a range of 20 nm to 600 nm.

10. The semiconductor device of claim 8, wherein the first dopant is phosphorus.

11. The semiconductor device of claim 8, wherein the first dopant is arsenic.

12. The semiconductor device of claim 8, wherein the first dopant is antimony.

13. The semiconductor device of claim 8, wherein the first well comprises point defects, the point defects having an area density of less than $5 \times 10^7$ cm$^{-2}$.

14. A semiconductor device comprising:

a first fin extending from a semiconductor substrate, the first fin comprising a first well, the first well having a first dopant with a concentration in a range of $10^{17}$ atoms/cm$^3$ to $10^{19}$ atoms/cm$^3$, the first well having substrate defects with an area density in a range of $1.0 \times 10^7$ cm$^{-2}$ to $5.0 \times 10^7$ cm$^{-2}$;

a channel region on the first well, wherein the concentration of the first dopant changes at a rate in a range of $2 \times 10^{17}$ atoms per cm$^3$ per nm to $4 \times 10^{17}$ atoms per cm$^3$ per nm across a boundary between the first well and the channel region;

a first source/drain region and a second source/drain region, the first source/drain region and the second source/drain region extending from the first fin; and a first gate electrode over the first fin.

15. The semiconductor device of claim 14, further comprising a second fin extending from the semiconductor substrate, the second fin comprising a second well, the second well having a second dopant, the second dopant being different from the first dopant.

16. The semiconductor device of claim 15, wherein the first dopant is an n-type dopant and the second dopant is a p-type dopant.

17. The semiconductor device of claim 15, wherein the first dopant is phosphorus or arsenic.

18. The semiconductor device of claim 15, wherein the second dopant is boron difluoride.

19. The semiconductor device of claim 15, wherein the second dopant is indium.

20. The semiconductor device of claim 14, wherein the channel region comprises a layer of silicon-germanium, and wherein the first dopant extends to a depth in a range of 20 nm to 600 nm below the layer of silicon-germanium.

* * * * *